US012660694B2

(12) United States Patent
Kim et al.

(10) Patent No.: US 12,660,694 B2
(45) Date of Patent: Jun. 16, 2026

(54) DISPLAY APPARATUS WITH IMPROVED LIGHT EXTRACTION EFFICIENCY

(71) Applicant: SAMSUNG ELECTRONICS CO., LTD., Suwon-si (KR)

(72) Inventors: Sihan Kim, Seoul (KR); Hankyu Seong, Seoul (KR); Jihye Yeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 845 days.

(21) Appl. No.: 17/991,032

(22) Filed: Nov. 21, 2022

(65) Prior Publication Data

US 2023/0215856 A1 Jul. 6, 2023

(30) Foreign Application Priority Data

Jan. 4, 2022 (KR) ........................ 10-2022-0000823

(51) Int. Cl.
*H10W 90/00* (2026.01)
*H10H 29/14* (2025.01)
(Continued)

(52) U.S. Cl.
CPC .......... *H10W 90/00* (2026.01); *H10H 29/142* (2025.01); *H10W 72/90* (2026.01);
(Continued)

(58) Field of Classification Search
CPC ......... H01L 25/18; H01L 24/05; H01L 24/08; H01L 24/80; H01L 25/167; H10H 29/142;
(Continued)

(56) References Cited

U.S. PATENT DOCUMENTS

| | | | |
|---|---|---|---|
| 2017/0250316 A1 | 8/2017 | Yeon et al. | |
| 2018/0047780 A1* | 2/2018 | Yeon ...................... | H10H 20/84 |
| 2019/0355786 A1* | 11/2019 | Iguchi ............... | H10H 20/8314 |
| 2019/0371779 A1 | 12/2019 | Yeon et al. | |
| 2020/0105980 A1* | 4/2020 | Sim ..................... | H10H 20/856 |

(Continued)

FOREIGN PATENT DOCUMENTS

| | | |
|---|---|---|
| CN | 110556455 A | 12/2019 |
| CN | 111384227 A | 7/2020 |

(Continued)

*Primary Examiner* — Mounir S Amer
*Assistant Examiner* — Nicholas B Michaud
(74) *Attorney, Agent, or Firm* — Muir Patent Law, PLLC

(57) ABSTRACT

A display apparatus includes: a circuit substrate; and a pixel array on the circuit substrate and including a plurality of pixels. The pixel array includes: light emitting diode (LED) cells constituting the plurality of pixels, each of the LED cells including a first conductivity-type semiconductor layer, an active layer, and a second conductivity-type semiconductor layer; wavelength converters on the LED cells; an upper semiconductor layer on the LED cells and having a partition structure; a passivation layer on side surfaces of the LED cells; a first electrode along a region of the LED cells to have a grid shape; second electrodes connected to the second conductivity-type semiconductor layers; and reflective layers between the first electrode and the second electrode along the passivation layer on the side surfaces of the LED cells and having surfaces inclined toward outside of the LED cells.

20 Claims, 29 Drawing Sheets

(51) Int. Cl.
　　*H10W 72/90*　　　(2026.01)
　　*H10W 80/00*　　　(2026.01)

(52) U.S. Cl.
　　CPC ........ *H10W 72/923* (2026.01); *H10W 72/934*
　　(2026.01); *H10W 72/9415* (2026.01); *H10W*
　　*72/942* (2026.01); *H10W 72/951* (2026.01);
　　*H10W 72/952* (2026.01); *H10W 72/953*
　　(2026.01); *H10W 80/327* (2026.01); *H10W*
　　*90/792* (2026.01)

(58) Field of Classification Search
　　CPC .. H10H 20/841; H10H 20/855; H10H 20/018;
　　　　H10H 20/819; H10H 20/84; H10H
　　　　20/8513; H10H 20/857; H10H 20/831;
　　　　H10H 20/835; H10H 20/8514; H10H
　　　　　　　　　　　　　　　　　　20/851
　　USPC .......................................................... 257/91
　　See application file for complete search history.

(56)　　　　　　　References Cited

U.S. PATENT DOCUMENTS

| | | | |
|---|---|---|---|
| 2020/0212267 A1 | 7/2020 | Kwak et al. | |
| 2020/0227592 A1 | 7/2020 | Zhang et al. | |
| 2020/0349882 A1* | 11/2020 | Kim ..................... | H10K 50/115 |
| 2021/0126045 A1* | 4/2021 | Yeon ..................... | H01L 24/08 |
| 2023/0037888 A1 | 2/2023 | Yeon | |

FOREIGN PATENT DOCUMENTS

| | | |
|---|---|---|
| CN | 111725251 A | 9/2020 |
| CN | 112993132 A | 6/2021 |
| JP | 2019-204823 A | 11/2019 |
| KR | 1020180068588 A | 6/2018 |
| KR | 10-2021-0043977 A | 4/2021 |
| KR | 1020210144983 A | 12/2021 |
| KR | 10-2023-0020236 A | 2/2023 |

* cited by examiner

10a

10b

10c

RLe

155

150

130e
112
114 }110
116
122
124
190
195

B

10f

RLf

155

150

130f
112
114 }110
116
122
124
190
195

B

DISPLAY APPARATUS WITH IMPROVED LIGHT EXTRACTION EFFICIENCY

CROSS-REFERENCE TO RELATED APPLICATION

This application claims benefit of priority to Korean Patent Application No. 10-2022-0000823, filed on Jan. 4, 2022, in the Korean Intellectual Property Office, the disclosure of which is incorporated herein by reference in its entirety.

BACKGROUND

1. Field

Embodiments relate to a display apparatus.

2. Description of the Related Art

A semiconductor light emitting diode (LED) may be used not only as a light source of a lighting device, but also as a light source of various electronic products. In particular, the LED may be widely used as a light source of various display apparatuses, e.g., televisions (TVs), mobile phones, personal computers (PCs), laptop PCs, personal digital assistants (PDAs), and the like.

A display apparatus may include a display panel, including liquid crystal display (LCD) panels, and backlights. Recently, however, display apparatuses, which use LEDs as pixels and thereby do not use an additional backlight, have been developed. Such display apparatuses may be made to be compact and may achieve high luminance with improved optical efficiency, as compared with LCDs.

SUMMARY

According to an embodiment, a display apparatus includes: a circuit substrate including driving circuits and first bonding electrodes; and a pixel array on the circuit substrate and including light emitting diode (LED) cells, constituting a plurality of pixels, and second bonding electrodes bonded to the first bonding electrodes. Each of the LED cells includes a first conductivity-type semiconductor layer, an active layer, and a second conductivity-type semiconductor layer, sequentially stacked. The pixel array further includes: wavelength converters on the LED cells; an upper semiconductor layer on the LED cells and having a partition structure surrounding side surfaces of the wavelength converters and separating the wavelength converters from each other; a passivation layer on side surfaces of the LED cells and having external side surfaces inclined to increase a thickness in direction toward the wavelength converters; a first electrode on the external side surfaces of the passivation layer and extending to a region between the LED cells; second electrodes, respectively on lower surfaces of the LED cells and connected to the second conductivity-type semiconductor layers; a common electrode on at least one side of the LED cells; and a pad electrode outside the LED cells.

According to an embodiment, a display apparatus includes: a circuit substrate including driving circuits; and a pixel array on the circuit substrate and including a plurality of pixels. The pixel array includes: light emitting diode (LED) cells constituting the plurality of pixels, each of the LED cells including a first conductivity-type semiconductor layer, an active layer, and a second conductivity-type semiconductor layer, sequentially stacked; wavelength converters on the LED cells; an upper semiconductor layer on the LED cells and having a partition structure surrounding side surfaces of the wavelength converters and separating the wavelength converters from each other; a passivation layer on side surfaces of the LED cells and extending to a portion of lower surfaces of the LED cells; a first electrode along a region of the LED cells to have a grid shape; second electrodes connected to the second conductivity-type semiconductor layers; and reflective layers between the first electrode and the second electrodes along the passivation layer on the side surfaces of the LED cells and having surfaces inclined toward outside of the LED cells.

According to an embodiment, a display apparatus includes: a circuit substrate including driving circuits and first bonding electrodes; and a pixel array on the circuit substrate and including light emitting diode (LED) cells constituting a plurality of pixels, each of the LED cells including a first conductivity-type semiconductor layer, an active layer, and a second conductivity-type semiconductor layer, sequentially stacked. The pixel array includes: wavelength converters on the LED cells; a passivation layer on side surfaces of the LED cells and having external side surfaces inclined to increase a thickness in a direction toward the wavelength converters; a first electrode having inclined surfaces in contact with the passivation layer; second electrodes connected to the second conductivity-type semiconductor layers; a common electrode on at least one side of the LED cells; and second bonding electrodes bonded to the first bonding electrodes. The first electrode is disposed in a region between the LED cells adjacent to each other to not overlap the LED cells vertically, and is electrically connected to a portion of the second bonding electrodes through the common electrode in an outside of the LED cells. Each of the second electrodes is disposed below a lower surface of each of the LED cells to overlap the LED cells vertically and is directly connected to a portion of the second bonding electrodes.

BRIEF DESCRIPTION OF DRAWINGS

Features will become apparent to those of skill in the art by describing in detail example embodiments with reference to the attached drawings in which.

DETAILED DESCRIPTION

In the descriptions below, terms "upper," "upper portion," "upper surface," "lower," "lower portion," "lower surface," "side surface," and the like, are used with reference to the diagrams unless otherwise specified, and may vary depending on a direction in which a device is disposed.

Figure 1A:
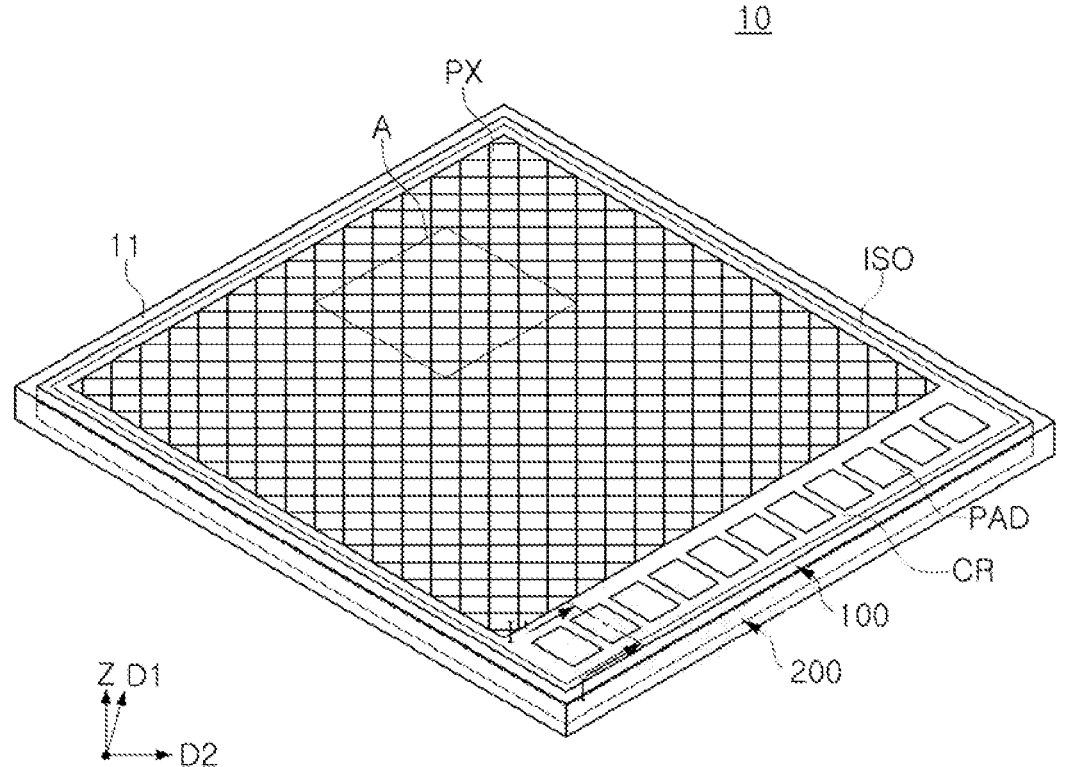
FIGS. 1A and 1B are a schematic perspective view and a schematic plan view of a display apparatus according to example embodiments, respectively.
Figure 1B:
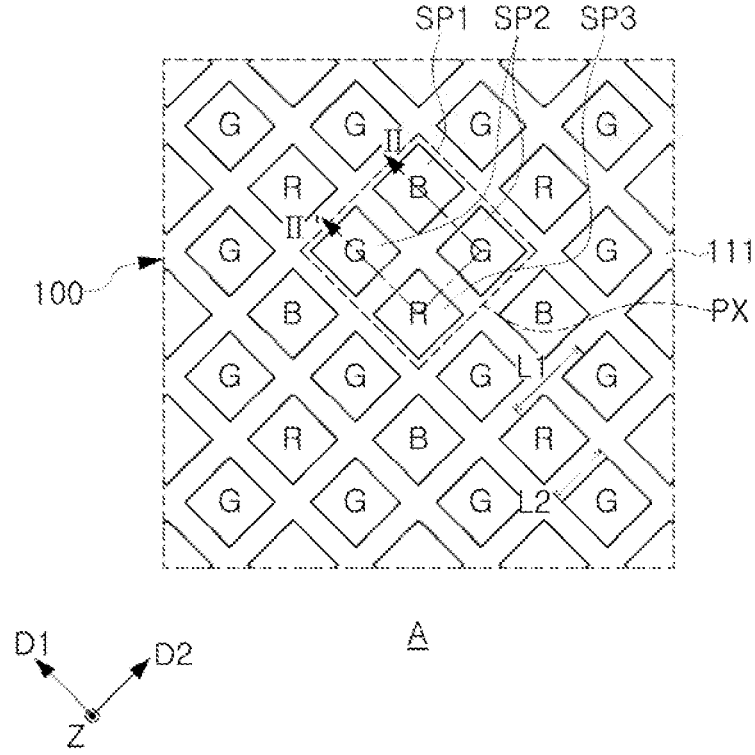

FIGS. 1A and 1B are a schematic perspective view and a schematic plan view of a display apparatus according to example embodiments, respectively. FIG. 1B is an enlarged plan view of portion "A" of FIG. 1A.

Referring to FIGS. 1A and 1$i$, a display apparatus 10 may include a circuit substrate 200 including driving circuits, and a pixel array 100 disposed on the circuit substrate 200 and including a plurality of pixels PX arranged therein. The display apparatus 10 may include a frame 11 surrounding the circuit substrate 200 and the pixel array 100.

The circuit substrate 200 may be a driving circuit substrate including thin film transistor (TFT) cells. In some example embodiments, the circuit substrate 200 may include only a portion of driving circuits for a display apparatus. In this case, the display apparatus 10 may include a driving device including another portion of the driving circuits. In some example embodiments, the circuit substrate 200 may be a flexible substrate, e.g., to implement a display apparatus that may have a curved profile.

The pixel array 100 may be an LED module for a display. The pixel array 100 may include connection pads PAD, a connection region CR connecting the plurality of pixels PX and the connection pads PAD to each other, and an edge region ISO.

Each of the plurality of pixels PX may include first to third sub-pixels SP1, SP2, and SP3 configured to emit lights of different specific wavelengths, e.g., specific colors to provide a color image. For example, the first to third sub-pixels SP1, SP2, and SP3 may be configured to emit blue (B) light, green (G) light, and red (R) light, respectively. In each of the pixels PX, the first to third sub-pixels SP1, SP2, and SP3 may be arranged in, e.g., a diamond pentile arrangement.

For example, each of the pixels PX may include first and second sub-pixels SP1 and SP2 of a first column and second and third sub-pixels SP2 and SP3 of a second column, respectively arranged in a first diagonal direction, e.g., a D1 direction. The first and second columns may be arranged in a second diagonal direction, perpendicular to the D1 direction, e.g., a D2 direction. In each of the pixels PX, the first to third sub-pixels SP1, SP2, and SP3 may be arranged in a diamond shape, e.g., the first sub-pixel SP1, the second sub-pixel SP2, the third sub-pixel SP3, and the second sub-pixel SP2 may be arranged clockwise in order. The pixels PX may be sequentially arranged in the directions D1 and D2.

In FIG. 1B, each of the pixels PX is illustrated as including first to third sub-pixels SP1, SP2, and SP3 arranged by four, but the number of sub-pixels constituting each pixel PX may be varied.

An upper semiconductor layer 111 (see also FIG. 2A) may be disposed between the first to third sub-pixels SP1, SP2, and SP3, as will be described in detail below.

Referring to FIG. 1B, in the directions D1 and D2, the first to third sub-pixels SP1, SP2, and SP3 may be arranged at a pitch of a first length L1. The first length L1 may range from about 1.5 m to about 2.0 m.

Each of the first to third sub-pixels SP1, SP2, and SP3 may have a second length L2 in the directions D1 and D2. The second length L2 may range from about 0.7 m to about 1.3 m.

In some example embodiments, the first to third sub-pixels SP1, SP2, and SP3 may be arranged in a Bayer pattern. In some example embodiments, some sub-pixels may be configured to emit light having a color, other than the illustrated colors R, G, and B, e.g., yellow light.

In the pixel array 100 of FIG. 1A, the number of the plurality of pixels PX arranged may be any suitable number, e.g., 1,024×768 or the like.

The connection pads PAD may be disposed on at least one side of the plurality of pixels PX along an edge of the display apparatus 10. The connection pads PAD may be electrically connected to the plurality of pixels PX and the driving circuits of the circuit substrate 200. The connection pads PAD may electrically connect an external device and the display apparatus 10 to each other. The number of connection pads PAD may vary according to example embodiments, and may be determined depending on, e.g., the number of pixels PX, a driving method of the TFT circuit in the circuit substrate 200, or the like.

The connection region CR may be disposed between the plurality of pixels PX and the connection pads PAD. An interconnection structure electrically connected to the plurality of pixels PX, e.g., a common electrode, may be disposed in the connection region CR.

The edge region ISO may be a region extending along edges of the pixel array 100. The edge region ISO may be a region in which the upper semiconductor layer 111 is not disposed, as described below with reference to FIG. 2A.

The frame 11 may be disposed around the pixel array 100 to be provided as a guide to define a space in which the pixel array 100 is disposed. The frame 11 may include at least one of, e.g., a polymer, a ceramic, a semiconductor, and a metal. The frame 11 may be configured as a black matrix. The frame 11 may be configured as a white matrix or a structure having a different color depending on a purpose of the display apparatus 10. For example, the white matrix may include a reflective material or a light scattering material.

Although the display apparatus 10 is illustrated as having a rectangular planar structure in FIG. 1, the display apparatus 10 may have a different shape according to example embodiments.

Figure 2A:
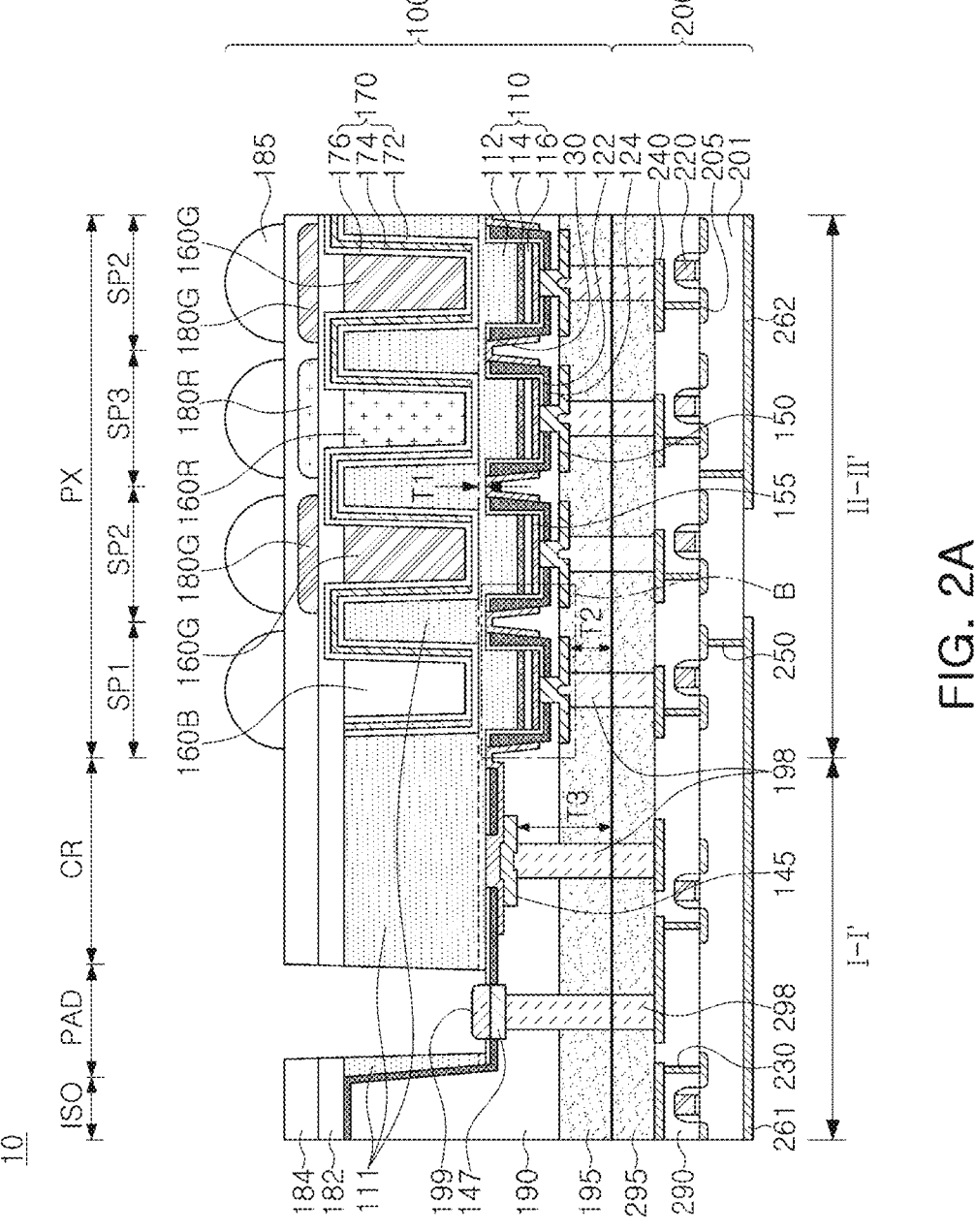
FIGS. 2A and 2B are a schematic cross-sectional view and a partially enlarged view of a display apparatus according to example embodiments, respectively.
Figure 2B:
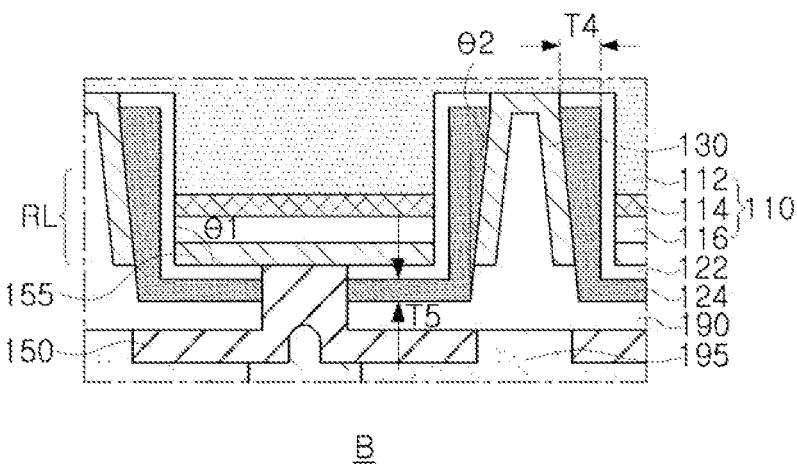

FIGS. 2A and 2B are a schematic cross-sectional view and a partially enlarged view of a display apparatus according to example embodiments, respectively. FIG. 2A illustrates both a cross-section, taken along I-I' of FIG. 1A, and a cross-section taken along II-II' of FIG. 1B. FIG. 2B is an enlarged view of portion "B" of FIG. 2A.

Figure 3:
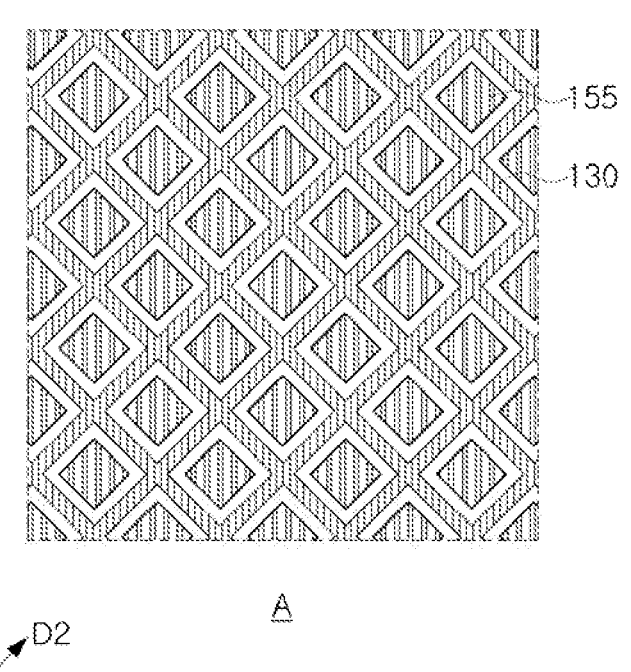
FIG. 3 is a schematic plan view of electrodes of a display apparatus according to example embodiments.

FIG. 3 is a schematic plan view of electrodes of a display apparatus according to example embodiments. FIG. 3 illustrates a region corresponding to portion "A" of FIG. 1A.

Referring to FIGS. 2A and 2B, the display apparatus 10 may include the circuit substrate 200 and the pixel array 100 disposed on the circuit substrate 200.

The circuit substrate 200 may include a semiconductor substrate 201, a driving circuit including driving elements 220 disposed on the semiconductor substrate 201 and including TFT cells, contact plugs 230 electrically connected to the driving elements 220, circuit interconnection lines 240 on the contact plugs 230, and a circuit insulating layer 290 covering the driving circuit. The circuit substrate 200 may include through-electrodes 250, such as a through-silicon via (TSV), connected to the driving circuit, first and second substrate interconnection lines 261 and 262 connected to the through-electrodes 250, a first bonding insulating layer 295 on the circuit insulating layer 290, and first bonding electrodes 298 disposed in the first bonding insulating layer 295 and connected to the circuit interconnection lines 240.

The semiconductor substrate 201 may include impurity regions including source/drain regions 205. The semiconductor substrate 201 may include, e.g., a semiconductor such as silicon (Si) or germanium (Ge), or a compound semiconductor such as SiGe, SiC, GaAs, InAs, or InP.

The driving circuit may include a circuit for controlling driving of a pixel or a sub-pixel. The source region 205 of the TFT cells may be electrically connected to an electrode of the LED cells 110 through the contact plug 230, the circuit interconnection line 240, and the first bonding electrode 298. The drain region 205 of the TFT cells may be connected to a first substrate interconnection line 261 through the through-electrode 250, and the first substrate interconnection line 261 may be electrically connected to a data line. Gate electrodes of the TFT cells may be connected to a second substrate interconnection line 262 through the through-electrode 250, or the like, and the second substrate interconnection line 262 may be electrically connected to a gate line. Such a circuit configuration and operation will be described in greater detail with reference to FIG. 4 below.

Upper surfaces of the first bonding electrodes 298 and upper surfaces of the first bonding insulating layer 295 may constitute an upper surface of the circuit substrate 200. The first bonding electrodes 298 may be bonded to the second bonding electrodes 198 of the pixel array 100 to provide an electrical connection path. The first bonding electrodes 298 may include a conductive material, e.g., copper (Cu). The first bonding insulating layer 295 may be bonded to the second bonding insulating layer 195 of the pixel array 100. The first bonding insulating layer 295 may include at least one of, e.g., SiO, SiN, SiCN, SiOC, SiON, and SiOCN.

The pixel array 100 may include the upper semiconductor layer 111, LED cells 110 on a lower surface of the upper semiconductor layer 111, first passivation layers 122 covering side surfaces of the LED cells 110, second passivation layers 124 covering a lower surface and side surfaces of the first passivation layer 122, first and second electrodes 130 and 150 electrically connected to the LED cells 110, wavelength converters 160B, 160G, and 160R on the LED cells 110, color filters 180G and 180R, and microlenses 185. The pixel array 100 may include contact layers 155 on lower surfaces of the LED cells 110, partition reflective layers 170 surrounding the side surfaces and lower surfaces of the wavelength converters 160B, 160G, and 160R, an encapsulation layer 182 and a planarization layer 184 on the wavelength converters 160B, 160G, and 160R, a common electrode 145, a first pad electrode 147, an interconnection insulating layer 190, a second bonding insulating layer 195, second bonding electrodes 198, and a second pad electrode 199.

The upper semiconductor layer 111 may be disposed on the LED cells 110. In the pixels PX, the upper semiconductor layer 111 may have a partition structure that surrounds side surfaces of the wavelength converters 160B, 160G, and 160R and separates the wavelength converters 160B, 160G, and 160R from each other. Due to the partition structure of the upper semiconductor layer 111, light emitted from the LED cells 110 may be emitted through the wavelength converters 160B, 160G, and 160R without interfering with each other.

The upper semiconductor layer 111 may have side surfaces, perpendicular to or inclined with respect to the lower surface of the LED cells 110, between the wavelength converters 160B, 160G, and 160R. For example, the upper semiconductor layer 111 may have inclined side surfaces between the wavelength converters 160B, 160G, and 160R to narrow a width of an upper portion, as compared with a width of a lower portion.

The upper semiconductor layer 111 may be disposed to extend in the connection region CR to form a continuous layer, rather than a partition structure, and may extend on the common electrode 145. The upper semiconductor layer 111 may be disposed in the connection pad PAD to have a configuration in which at least a portion is removed, and may not be disposed in the edge region ISO.

The upper semiconductor layer 111 may include a region integrated or continued with a first conductivity-type semiconductor layer 112 of the LED cells 110. The upper semiconductor layer 111 may be a layer grown during a growth process of the LED cells 110. For example, the upper semiconductor layer 111 may include a same material as the first conductivity-type semiconductor layer 112 in at least a region adjacent to the first conductivity-type semiconductor layer 112. The upper semiconductor layer 111 may include an undoped layer and a doped layer. The upper semiconductor layer 111 may include an epitaxial nitride semiconductor layer. An interface between the upper semiconductor layer 111 and the first conductivity-type semiconductor layer 112 may not be distinguished. However, the upper semiconductor layer 111 and the first conductivity-type semiconductor layer 112 may be substantially distinguished and recognized by positions of lower surfaces of the partition reflective layers 170.

The LED cells 110 may constitute each of the plurality of pixels PX, and may respectively constitute a micro LED. The LED cells 110 may be arranged in columns and rows. The LED cells 110, e.g., each of the LED cells 110, may generate blue light, e.g., light having a wavelength of 435 nm to 460 nm. Each of the LED cells 110 may include the first conductivity-type semiconductor layer 112, an active layer 114, and a second conductivity-type semiconductor layer 116, sequentially stacked on the lower surface of the upper semiconductor layer 111.

First conductivity-type semiconductor layers 112 may be extended from upper regions of the pixel PX to the connection region CR and a portion of the connection pad PAD along the upper semiconductor layer 111. The first conductivity-type semiconductor layers 112 may be connected to each other by the upper regions between the first to third sub-pixels SP1, SP2, and SP3, to be disposed as one layer, e.g., a single layer, and may also be connected between the pixels PX to be disposed as a single layer. A thickness T1 of each of the upper regions of the first conductivity-type semiconductor layers 112 may be, e.g., in a range of about 0.1 m to about 1.0 m.

The active layers 114 and the second conductivity-type semiconductor layers 116 may be disposed only in the pixel PX, and may be disposed between the LED cells 110 to be separated and spaced apart from each other.

Although the first conductivity-type semiconductor layers 112 are disposed between the LED cells 110 to be connected to each other in an example embodiment, each of the LED cells 110 may be defined separately by side surfaces of the active layers 114 and side surfaces of the second conductivity-type semiconductor layers 116. Hereinafter, the first conductivity-type semiconductor layers 112 of the LED cells 110 may be described as being connected to each other.

The first conductivity-type semiconductor layer 112, the active layer 114, and the second conductivity-type semiconductor layer 116 may be formed of a nitride semiconductor, and may be an epitaxial layer. The first conductivity-type semiconductor layer 112 and the second conductivity-type semiconductor layer 116 may respectively be N-type and P-type nitride semiconductor layers having a composition of $In_xAl_yGa_{1-x-y}N$ (0≤x<1, 0≤y<1, 0≤x+y<1). For example, the first conductivity-type semiconductor layer 112 may be an N-type gallium nitride (n-GaN) layer doped with silicon (Si), germanium (Ge), or carbon (C), and the second conductivity-type semiconductor layer 116 may be a P-type gallium nitride (p-GaN) layer doped with magnesium (Mg) or zinc (Zn). In some example embodiments, the first conductivity-type semiconductor layer 112 and the second conductivity-type semiconductor layer 116 may be formed of an aluminum indium gallium phosphide (AlInGaP)-based semiconductor or an aluminum indium gallium arsenide (AlInGaAs)-based semiconductor, in addition to the nitride semiconductor. Each of the first conductivity-type semiconductor layer 112 and the second conductivity-type semiconductor layer 116 may be formed as a single layer, or may include a plurality of layers having different characteristics for example, a doping concentration, a composition, or the like.

The active layer 114 may emit light having a predetermined energy by the recombination of electrons and holes. The active layer 114 may have a single quantum well (SQW) structure or a multiple quantum well (MQW) structure, in which quantum barrier layers and quantum well layers are alternately disposed with each other. The quantum well layer and the quantum barrier layer may be an $In_xAl_yGa_{1-x-y}N$ (0≤x≤1, 0≤y≤1, 0≤x+y≤1) layer having different compositions. For example, the quantum well layer may be an $In_xGa_{1-x}N$ (0<x≤1) layer, and the quantum barrier layer may be a GaN layer or an AlGaN layer.

Referring to FIG. 2B, in each of the LED cells 110, an angle θ1 between the lower surface and the side surfaces thereof may be a right angle or an angle close to a right angle. For example, the angle θ1 may range from about 85 degrees to about 95 degrees. The LED cells 110 may have such a structure by sequentially performing a dry etching process and a wet etching process, as will be described below with reference to FIG. 9C.

The first and second passivation layers 122 and 124 may cover side surfaces and at least portions of lower surfaces of the LED cells 110, and may extend to the connection region CR and the connection pad PAD. Herein, the second passivation layers 124 may be referred to as "passivation layers" and the first passivation layer 122 may be referred to as "upper passivation layers."

The first passivation layers 122 may have a substantially uniform thickness and may extend conformally. Accordingly, the first passivation layers 122 may have external side surfaces, which are substantially perpendicular to the lower surfaces of the LED cells 110, on the side surfaces of the LED cells 110. The first passivation layer 122 may be disposed to cover the lower surface of the first conductivity-type semiconductor layer 112 in the connection region CR and the connection pad PAD. In an example embodiment, the first passivation layer 122 may not extend to the edge region ISO. Terms such as "uniform," "same" "equal" "planar" or "coplanar," as used herein when referring to thickness, orientation, layout, location, shapes, sizes, compositions, amounts, or other measures do not necessarily mean an exactly uniform or identical thickness, orientation, layout, location, shape, size, composition, amount, or other measure, but are intended to encompass nearly uniform or identical thickness, orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially uniform." "substantially the same." "substantially equal," or "substantially planar," may be exactly uniform, the same, equal, or planar, or may be uniform, the same, equal, or planar within acceptable variations that may occur, for example, due to manufacturing processes. For example, a layer with a "substantially uniform thickness" is functionally acceptable but may not be perfectly uniform in a mathematical sense given that atomic level uniformity is very difficult to achieve in mass production.

The second passivation layers 124 may cover external side surfaces of the first passivation layers 122 on side surfaces of the LED cells 110, and may extend along the first passivation layers 122. The second passivation layers 124 may extend on a portion of the lower surfaces of the LED cells 110 along the first passivation layers 122. The second passivation layer 124 may extend to the connection region CR and the connection pad PAD, and may further extend to the edge region ISO.

Referring to FIG. 2B, the second passivation layers 124 may have non-uniform thicknesses. For example, the second passivation layers 124 may have external side surfaces inclined to increase in thickness in a direction toward the wavelength converters 160B, 160G, and 160R. The external side surfaces may be surfaces facing to an external side of the LED cell 110. On one side of the LED cell 110, the second passivation layer 124 may have a fourth thickness T4 on an upper end thereof and a fifth thickness T5, smaller than the fourth thickness T4, on a lower end thereof. The thickness of the second passivation layer 124 may range from about 20 nm to about 500 nm. For example, the fourth thickness T4 may range from about 100 nm to about 500 nm, and the fifth thickness T5 may range from about 20 nm to about 40 nm. In some example embodiments, the thickness of the second passivation layer 124 may be determined in consideration of a distance between the LED cells 110 and a slope of the second passivation layer 124.

An angle θ2, at which the external side surface of the second passivation layer 124 is inclined in a vertical direction, may be in a range of, e.g., about 10 degrees to about 50 degrees relative to vertical. In some example embodiments, the angle θ2 may be determined in consideration of light extraction efficiency of the LED cells 110, the distance between the LED cells 110, the thickness of the second passivation layer 124, or the like.

The first and second passivation layers 122 and 124 may include different materials. The first and second passivation layers 122 and 124 may include a light-transmitting and insulating material. For example, the first passivation layers 122 may include a metal oxide, and the second passivation layers 124 may include a semiconductor oxide. For example, the second passivation layers 124 may include at least one of $SiO_2$, SiN, SiCN, SiOC, SiON, and SiOCN, and the first passivation layers 122 may include a hafnium oxide ($HfO_2$) and/or an aluminum oxide ($Al_2O_3$) in a region in contact with the second passivation layers 124, in addition to the semiconductor oxide. In an example embodiment, the first passivation layers 122 may have a multilayer structure.

The first electrode 130 may be connected to the first conductivity-type semiconductor layer 112. The first electrode 130 may be disposed to be spaced apart from the LED cells 110 by the first and second passivation layers 122 and 124 on the side surfaces of the LED cells 110, and may extend outwardly of the LED cells 110. The first electrode 130 may be disposed on the second passivation layers 124 with a substantially uniform thickness, to have inclined internal and external surfaces formed by the inclined external surfaces of the second passivation layers 124. The internal and external surfaces of the first electrode 130 may be inclined toward an external side of the LED cells 110. The first electrode 130 may have an angle of inclination the same as or similar to that of the second passivation layers 124. When the first electrode 130 has inclined side surfaces as described above, the light emitted from the active layer 114 may be reflected upwardly with high efficiency.

In the first electrode 130, a region having such inclined side surfaces may be referred to as a reflective region RL or a reflective layer, separately from a contact region in contact with the first conductivity-type semiconductor layer 112. The reflective region RL may be positioned between the contact region of the first electrode 130 and the second electrode 150 along the second passivation layer 124 or the inclined external surface of the second passivation layer 124. In some example embodiments, in the first electrode 130, the reflective region RL and the other region may include different materials or may be formed in different processes, so that they may have boundaries separated from each other and may be connected to each other.

The first electrode 130 may extend outwardly of the LED cells 110, and may be connected in regions between the adjacent LED cells 110 to be disposed as a single layer. The first electrode 130 may have a shape extending from one side surface of one LED cell 110 to opposing side surfaces of the adjacent LED cell 110. The first electrode 130 may be disposed to have an inverted U-shape or an inverted V-shape between adjacent LED cells 110.

Referring to FIG. 3, the first electrode 130 may include lines extending in the directions D1 and D2 along regions between the pixels PX and between the first to third sub-pixels SP1, SP2, and SP3. The lines may extend along boundaries of the LED cells 110, and may have a shape surrounding each of the contact layers 155. The first electrode 130 may have a grid shape or a mesh shape in which the lines are connected to each other. In the first electrode 130, the outermost lines disposed on outermost sides of the lines may be connected to a common electrode 145 as illustrated in FIG. 2A.

The first electrode 130 may be electrically connected to the first conductivity-type semiconductor layer 112 in a region between the LED cells 110. For example, a region in which the first electrode 130 is in contact with the first conductivity-type semiconductor layer 112 may overlap the partition structure of the upper semiconductor layer 111. In an example embodiment, the first electrode 130 may be disposed to not overlap the LED cells 110, in particular, the active layer 114 and the second conductivity-type semiconductor layer 116 in a vertical direction. In an example embodiment, the first electrode 130 may be disposed to not overlap the wavelength converters 160B, 160G, and 160R in the vertical direction. The first electrode 130 may extend to the connection region CR in the outermost portion of the pixels PX, and may be connected to the first conductivity-type semiconductor layer 112 in the connection region CR and physically and electrically connected to the common electrode 145. In some example embodiments, the first electrode 130 in a region between the LED cells 110 may be spaced apart from the first conductivity-type semiconductor layer 112 by the first and second passivation layers 122 and 124.

The first electrode 130 may include a reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au). In some example embodiments, the first electrode 130 may be formed of a single layer or a multilayer structure of a conductive material.

The contact layer 155 and the second electrode 150 may be sequentially arranged on lower surfaces of the second conductivity-type semiconductor layer 116, and may be connected to the second conductivity-type semiconductor layer 116. The contact layer 155 may be disposed to cover, e.g., an entire lower surface of the second conductivity-type semiconductor layer 116. The second electrode 150 may be disposed to overlap the LED cells 110 below each of the LED cells 110 in a vertical direction. The second electrode 150 may be disposed below the contact layer 155 to be connected to the contact layer 155. In an example embodiment, a length of the second electrode 150 in one direction may be the same as or similar to a length of the LED cells 110. In some example embodiments, the second electrodes 150 may be omitted. In this case, the contact layers 155 may be directly connected to underlying second bonding electrodes 198.

The contact layers 155 and the second electrodes 150 may include a highly reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

The wavelength converters 160B, 160G, and 160R may be disposed on the LED cells 110, respectively. Each of the wavelength converters 160R, 160G, and 160B may be a region in which a wavelength conversion material, e.g., a quantum dot dispersed in a cured binder resin, is filled in the partition structure of the upper semiconductor layer 111. Quantum dots for respectively converting blue light into red light and green light may be included in a second wavelength converter 160G and a third wavelength converter 160R, respectively, and only a binder resin, without quantum dots, may be included in a first wavelength converter 160B, to constitute a transparent resin portion. In an example embodiment, the wavelength converters 160B, 160G, and 160R may have a shape such that side surfaces are inclined such that a width of the upper portion is greater than a width of the lower portion.

The partition reflective layers 170 may be disposed to surround the side and lower surfaces of the wavelength converters 160R, 160G, and 160B in the partition structure of the upper semiconductor layer 111. The partition reflective layers 170 may extend on an upper surface of the upper semiconductor layer 111 between the wavelength converters 160B, 160G, and 160R. Each of the partition reflective layers 170 may include a first partition insulating layer 172, a partition metal layer 174, and a second partition insulating layer 176, sequentially disposed from the bottom. The partition metal layer 174 may be disposed only on the side surfaces of the wavelength converters 160R, 160G, and 160B and on the upper surface of the upper semiconductor layer 111, and may not be disposed below the lower surfaces of the wavelength converters 160R, 160G, and 160B. Lower surfaces of the partition reflective layers 170 may be disposed on a level that is higher than a level of an uppermost surface of the first electrode 130. The first partition insulating layer 172 and the second partition insulating layer 176 may include an insulating material, e.g., at least one of $SiO_2$, SiN, SiCN, SiOC, SiON, and SiOCN. The partition metal layer 174 may include a reflective metal, e.g., at least one of silver (Ag), nickel (Ni), and aluminum (Al).

The encapsulation layer 182 may be disposed to cover upper surfaces of the wavelength converters 160R, 160G, and 160B and upper surfaces of the partition reflective layer 170. The encapsulation layer 182 may function as a protective layer preventing deterioration of the wavelength converters 160R, 160G, and 160B. In some example embodiments, the encapsulation layer 182 may be omitted.

The color filters 180R and 180G may be disposed on the second and third wavelength converters 160G and 160R in the second and third sub-pixels SP2 and SP3, respectively. The color filters 180R and 180G may increase color purity of light emitted through the second wavelength converter 160G and the third wavelength converter 160R. In some example embodiments, a color filter may be further disposed on the first wavelength converter 160B.

The planarization layer 184 may be disposed to cover upper surfaces of the color filters 180G and 180R and the encapsulation layer 182. The planarization layer 184 may be a transparent layer.

The microlenses 185 may be disposed on the planarization layer 184 to respectively correspond to the wavelength converters 160R, 160G, and 160B. The microlenses 185 may collect light incident from the wavelength converters 160R, 160G, and 160B. The microlenses 185 may have a diameter greater than a width of each of the LED cells 110 in one direction. The microlenses 185 may be formed of, e.g., a transparent photoresist material or a transparent thermosetting resin.

The common electrode 145 and the first pad electrode 147 may be arranged in the connection region CR and the connection pad PAD, respectively. The common electrode 145 may be disposed on a lower surface of the first electrode 130 extending from the pixel PX, to connect the first electrode 130 to the second bonding electrode 198. The common electrode 145 may constitute a common electrode structure on an external side of the LED cells 110, together with the first electrode 130. The common electrode 145 may be disposed to have a rectangular ring shape or a ring shape, to entirely surround the pixels PX in plan view, and may be connected to end portions of the first electrode 130. An arrangement of the common electrode 145 may vary according to example embodiments. For example, in some embodiments, the common electrode 145 may have a partial shape of a square ring or a partial shape of a ring so as to surround a part of the pixels PX in a plan view. The first pad electrode 147 may be disposed below the second pad electrode 199 in the connection pad PAD to connect the second pad electrode 199 and the second bonding electrode 198 to each other. The common electrode 145 and the first pad electrode 147 may include at least one conductive material, e.g., silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), or gold (Au).

The second pad electrode 199 may be disposed on the first pad electrode 147 in the connection pad PAD. The second pad electrode 199 may be disposed to expose at least an upper surface thereof in an upward direction, e.g., to be exposed by an opening that penetrates through the upper semiconductor layer 111 and the first conductivity-type semiconductor layer 112. The second pad electrode 199 may be connected to an external device, e.g., an external circuit for applying an electrical signal to the circuit substrate 200 or the like, by wire bonding or anisotropic conductive film (AFC) bonding. The second pad electrode 199 may electrically connect the driving circuits of the circuit substrate 200 and the external device. The second pad electrode 199 may include a metal, e.g., gold (Au), silver (Ag), nickel (Ni), or the like.

The second bonding electrodes 198 may connect the second electrodes 150, the common electrode 145, and the first pad electrode 147 to the first bonding electrodes 298 of the circuit substrate 200. The second bonding electrodes 198 may be connected to the second electrodes 150 below the second electrodes 150 in the pixel PX, may be connected to the common electrode 145 in the connection region CR, and may be connected to the first pad electrode 147 in the connection pad PAD. Among the second bonding electrodes 198, a second bonding electrode 198 connected to the second electrodes 150 may have a second thickness T2 or a second height, and a second bonding electrode 198 connected to the common electrode 145 and the first pad electrode 147 may have a third thickness T3 or a third height, greater than the second thickness T2. The first electrode 130 may be connected to the second bonding electrodes 198 through the common electrode 145, and the second electrodes 150 may be directly connected to the second bonding electrodes 198.

The second bonding electrodes 198 may be disposed to penetrate through the interconnection insulating layer 190 and the second bonding insulating layer 195. The second bonding electrodes 198 may have a pillar shape, e.g., a cylindrical shape or the like. According to example embodiments, the second bonding electrodes 198 may have sidewalls inclined such that a size of an upper surface thereof is smaller than a size of a lower surface thereof. The second bonding electrodes 198 may include, e.g., copper (Cu). The second bonding electrodes 198 may include a barrier metal layer, e.g., a tantalum (Ta) layer and/or a tantalum nitride (TaN) layer, on upper and side surfaces thereof.

The interconnection insulating layer 190, together with the second bonding insulating layer 195, may be disposed below the LED cells 110 and the upper semiconductor layer 111. The interconnection insulating layer 190 may include silicon oxide or a silicon oxide-based insulating material, e.g., tetraethyl ortho silicate (TEOS), undoped silicate glass (USG), phosphosilicate glass (PSG), borosilicate glass (BSG), borophosphosilicate glass (BPSG), fluoride silicate glass (FSG), spin on glass (SOG), Tonen Silazane (TOSZ), or combinations thereof.

Lower surfaces of the second bonding insulating layer 195 may be disposed together with lower surfaces of the second bonding electrodes 198 to constitute a lower surface of the pixel array 100. The second bonding insulating layer 195 may constitute dielectric-to-dielectric bonding with the first bonding insulating layer 295. The circuit substrate 200 and the pixel array 100 may be bonded by bonding the first bonding electrodes 298 and the second bonding electrodes 198, and by bonding the first bonding insulating layer 295 and the second bonding insulating layer 195. The bonding of the first bonding electrodes 298 and the second bonding electrodes 198 may be, e.g., copper (Cu)-to-copper (Cu) bonding, and the bonding of the first bonding insulating layer 295 and the second bonding insulating layer 195 may be, e.g., dielectric-to-dielectric bonding such as SiCN-to-SiCN bonding. The circuit substrate 200 and the pixel array 100 may be bonded by hybrid bonding including the copper (Cu)-to-copper (Cu) bonding and the dielectric-to-dielectric bonding, and may be bonded without an adhesive layer.

The display apparatus 10 according to the present embodiment may optimize an arrangement of electrode structures including the first electrode 130, and may bond the circuit substrate 200 and the pixel array 100 using hybrid bonding, to implement a miniaturized, high-resolution device.

Figure 4:
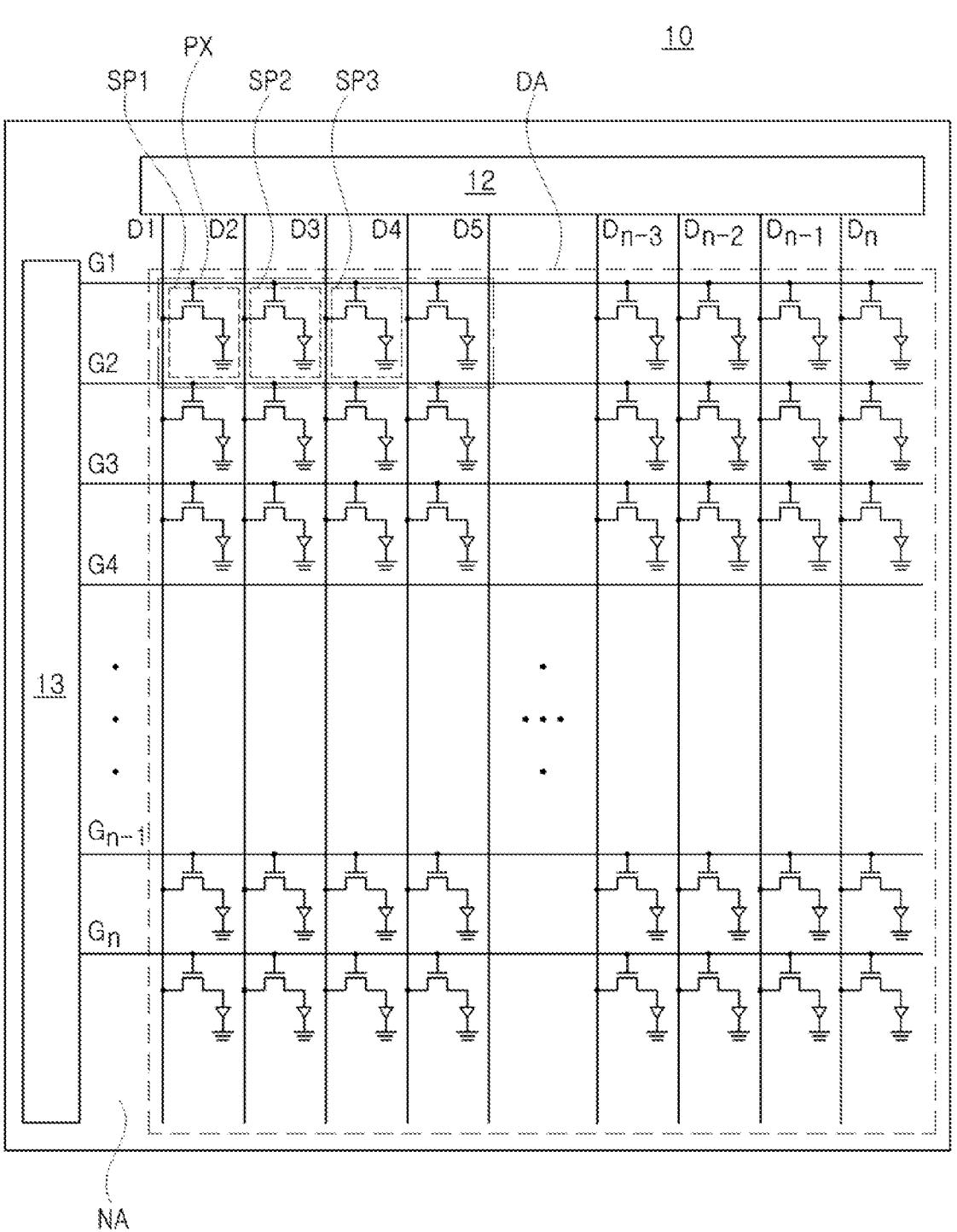
FIG. 4 is a plan view of a driving circuit implemented in a display apparatus according to example embodiments.

FIG. 4 is a plan view of a driving circuit implemented in a display apparatus according to example embodiments.

Referring to FIG. 4, a circuit diagram of the display apparatus 10 in which n×n sub-pixels are arranged is illustrated. The first to third sub-pixels SP1, SP2, and SP3 may transmit data signals through data lines D1 to Dn, which may be disposed as paths in a vertical direction, e.g., a column direction, respectively. The first to third sub-pixels SP1, SP2, and SP3 may transmit a control signal, e.g., a gate signal, through the gate lines G1 to Gn, in a horizontal direction, e.g., a row direction path.

The plurality of pixels PX including the first to third sub-pixels SP1, SP2, and SP3 may provide an active region DA for a display, and the active region DA may be provided as a display region for a user. A non-active region NA may be formed along at least one edge of the active region DA. The non-active region NA may extend along a peripheral portion of a panel of the display apparatus 10, may be a region in which the pixels PX are not present, and may correspond to the frame 11 (see FIG. 1A) of the display apparatus 10.

First and second driver circuits 12 and 13 may be employed to control operations of the pixels PX, e.g., the first to third sub-pixels SP1, SP2, and SP3. Some or all of the first and second driver circuits 12 and 13 may be implemented on the circuit substrate 200 (see FIG. 1A). The first and second driver circuits 12 and 13 may be formed of an integrated circuit, a thin film transistor panel circuit, or other suitable circuit, and may be disposed in the non-active region NA of the display apparatus 10. The first and second driver circuits 12 and 13 may include, e.g., a microprocessor, a memory such as a storage unit, a processing circuit, and a communications circuit.

To display an image with the pixels PX, the first driver circuit 12 may transmit a clock signal and other control signals to the second driver circuit 13, e.g., a gate driver circuit, while supplying image data to the data lines D1 to Dn. The second driver circuit 13 may be implemented using an integrated circuit and/or a thin film transistor circuit. The gate signal for controlling the first to third sub-pixels SP1, SP2, and SP3 arranged in the row direction may be transmitted through the gate lines G1 to Gn of the display apparatus 10.

Figure 5A:
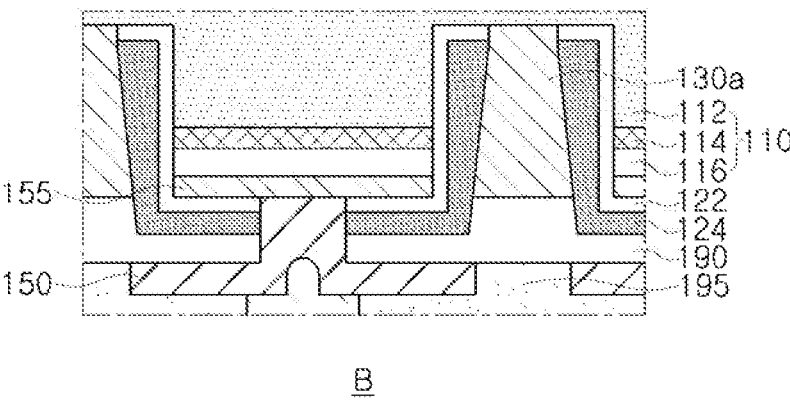
FIGS. 5A to 5C are schematic partially-enlarged views of a display apparatus according to example embodiments.
Figure 5B:
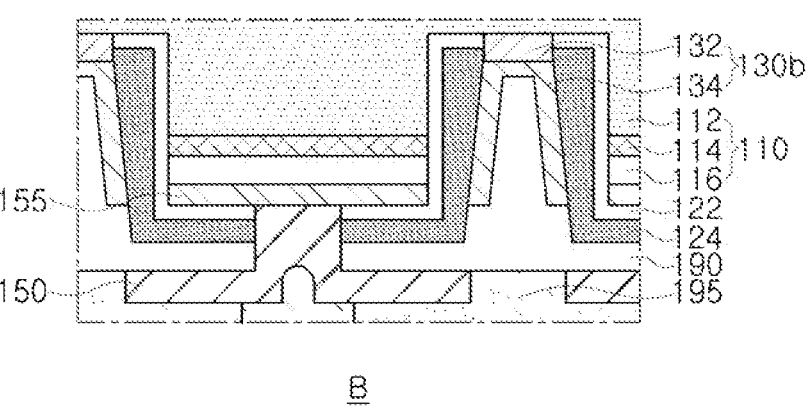
Figure 5C:
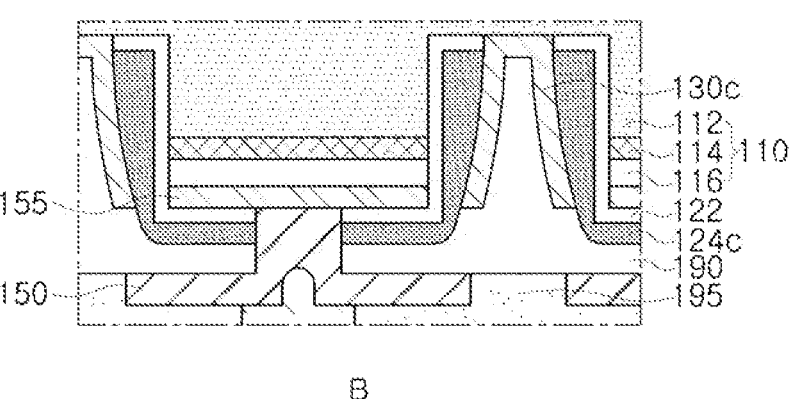

FIGS. 5A to 5C are schematic partially-enlarged views of a display apparatus according to example embodiments. FIGS. 5a to 5c illustrate a region corresponding to region "B" of FIG. 2B.

Referring to FIG. 5A, in a display apparatus 10a, a first reflective electrode 130a may be disposed to fill a space between first and second passivation layers 122 and 124 between LED cells 110. Specifically, the first reflective electrode 130a may be disposed to not have a substantially uniform thickness conformally as in the example embodiment of FIG. 2B, but may be disposed to be formed to be relatively thick to fill a space between the LED cells 110. Also in this case, in the first reflective electrode 130a, the side surfaces facing the LED cells 110 may be inclined surfaces. Even in this case, the first reflective electrode 130a may be arranged in the form of lines extending along the boundaries between the LED cells 110, and may be arranged in the form of a grid or a mesh. As described above, a relative thickness and a partial shape of the first reflective electrode 130a may vary according to example embodiment.

Referring to FIG. 5B, in a display apparatus 10b, a first electrode 130b may include an ohmic contact layer 132 and a reflective electrode layer 134. The ohmic contact layer 132 may be disposed to be connected to a first conductivity-type semiconductor layer 112, and the reflective electrode layer 134 may be disposed to extend on side surfaces of LED cells.

In some example embodiments, the ohmic contact layer 132 may be formed between two first to third sub-pixels SP1, SP2, and SP3 adjacent to each other, or a center of four first to third sub-pixels SP1, SP2, and SP3 adjacent to each other. For example, the ohmic contact layer 132 may be disposed in a central region of the four first to third sub-pixels SP1, SP2, and SP3 arranged in a diamond shape. In this case, even when it is difficult to dispose the first electrode 130b to be directly connected to the first conductivity-type semiconductor layer 112 in all regions, the ohmic contact layers 132 may be disposed in central regions of the four first to third sub-pixels SP1, SP2, and SP3 arranged in a diamond shape, which are relatively wide regions, to secure electrical connection.

The ohmic contact layer 132 and the reflective electrode layer 134 may include the same material or different materials.

Referring to FIG. 5C, in a display apparatus 10c, a second passivation layer 124c may have a rounded slope, as compared with second passivation layer 124 of the example embodiment of FIG. 2B. Accordingly, a first electrode 130c may have an internal surface and an external surface, which are overall sloping curved surfaces.

As described above, in example embodiments, the shape of the external surface of the second passivation layer 124 may vary within a range in which the external surface of the second passivation layer 124 has an overall inclination. Accordingly, the shape of the inclined side surfaces of the first electrode 130c may also vary.

Figure 6A:
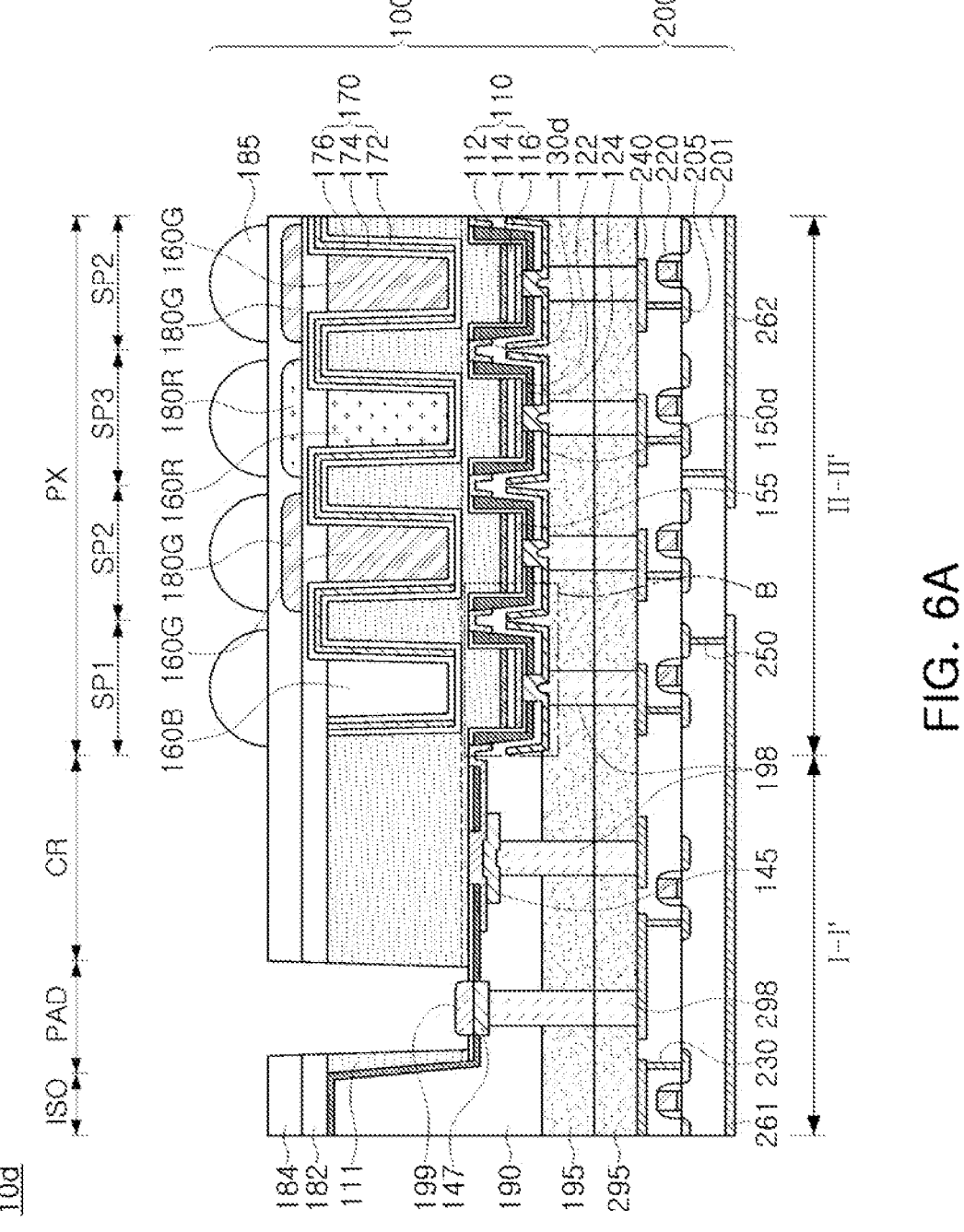
FIGS. 6A and 6B are a schematic cross-sectional view and a partially enlarged view of a display apparatus according to example embodiments, respectively.
Figure 6B:
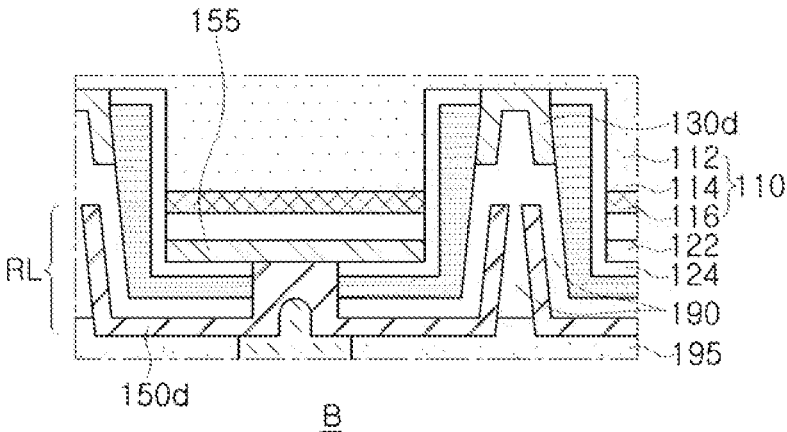

FIGS. 6A and 6B are a schematic cross-sectional view and a partially enlarged view of a display apparatus according to example embodiments, respectively. FIG. 6B is an enlarged view of portion "B" of FIG. 6A.

Referring to FIGS. 6A and 6B, in a pixel array 100 of a display apparatus 10d, first electrode 130d and the second electrodes 150d have shapes, different from those in the example embodiment of FIGS. 2A and 2B.

The first electrode 130d may be connected to the first conductivity-type semiconductor layer 112, and only a portion thereof may or may not extend downwardly along side surfaces of LED cells 110. The second electrodes 150d may extend upwardly along side surfaces of the LED cells 110. Accordingly, in the present embodiment, instead of the first electrode 130d, the second electrodes 150d may include reflective regions RL, may be connected to the reflective regions RL, or may be integrated with the reflective regions RL. In some example embodiments, in the second electrodes 150d, the reflective regions RL and the other regions may include different materials or may be formed in different processes, so that boundaries therebetween may be distinguished from each other.

In the present example embodiment, an interconnection insulating layer 190 may include a region covering the second passivation layers 124 and the first electrode 130d. Reflective regions RL of the second electrodes 150d may be spaced apart from the second passivation layers 124 and the first electrode 130d by the region of the interconnection insulating layer 190. Relative lengths of the first electrode 130d and the second electrodes 150d on the side surfaces of the LED cells 110 may vary according to example embodiments.

Figure 7A:
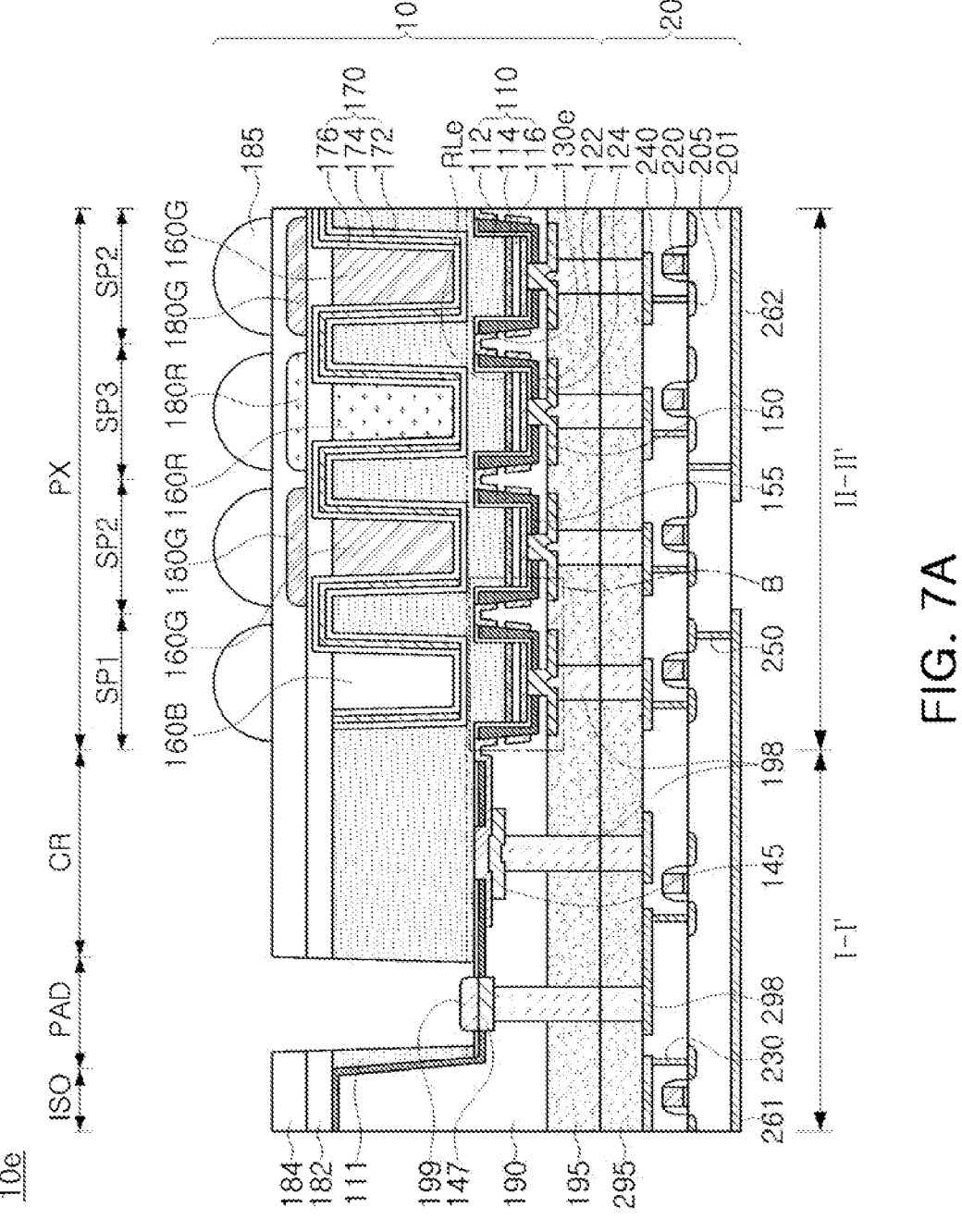
FIGS. 7A and 7B are a schematic cross-sectional view and a partially enlarged view of a display apparatus according to example embodiments, respectively.
Figure 7B:
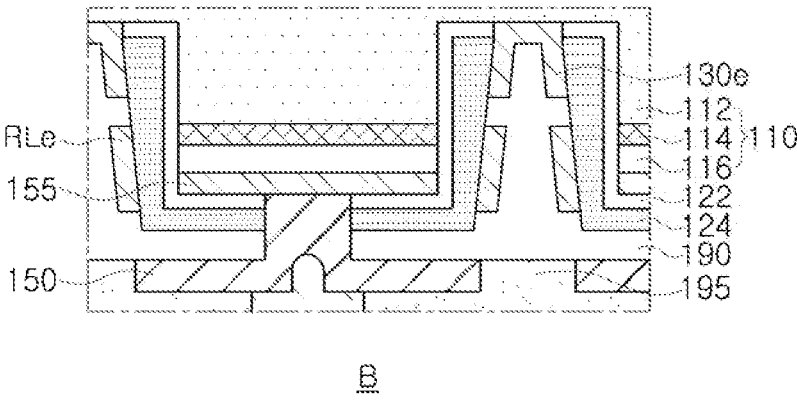

FIGS. 7A and 7B are a schematic cross-sectional view and a partially enlarged view of a display apparatus according to example embodiments, respectively. FIG. 7B is an enlarged view of portion "B" of FIG. 7A.

Referring to FIGS. 7A and 7B, the pixel array 100 of a display apparatus 10e may include reflective layers RLe. The reflective layers RLe may be disposed on side surfaces of the LED cells 110 to be spaced apart from a first electrode 130e and the second electrodes 150. The reflective layers RLe may be disposed between the first electrode 130e and the second electrodes 150 in a vertical direction or along the side surfaces of the LED cells 110. The reflective layers RLe may be disposed between the first electrode 130e and the second electrodes 150 along the second passivation layers 124 on the side surfaces of the LED cells 110. On the side surfaces of each of the LED cells 110, the reflective layers RLe may be inclined such that a distance between upper ends thereof is greater than a distance between lower ends thereof.

In the present example embodiment, the reflective layers RLe may be in a floating state in which an electrical signal is not applied. Accordingly, even when a distance between the LED cells 110 is relatively small, a defect such as short-circuit may be prevented from occurring between the first electrode 130e and the second electrodes 150. The reflective layers RLe may include a reflective metal, e.g., at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

Figure 8:
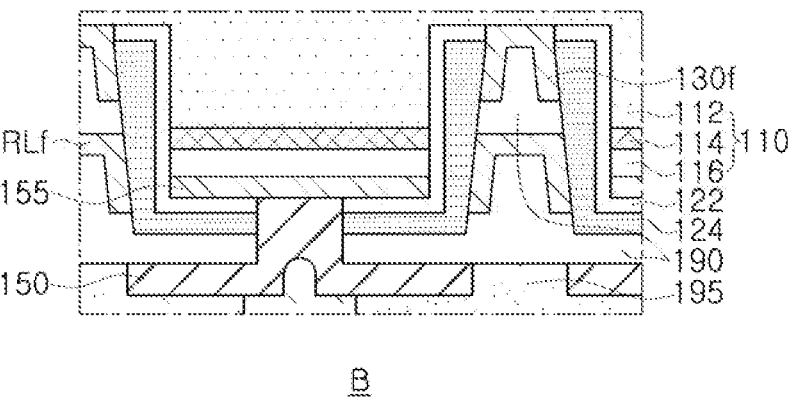
FIG. 8 is a schematic partially-enlarged view of a display apparatus according to example embodiments.

FIG. 8 is a schematic partially-enlarged view of a display apparatus according to example embodiments. FIG. 8 illustrates a region corresponding to FIG. 7B.

Referring to FIG. 8, in a display apparatus 10f, a reflective layer RLf may have a shape, different from that in the example embodiment of FIGS. 7A and 7B. For example, the reflective layer RLf may have a shape connected between the LED cells 110 adjacent to each other. The reflective layer RLf may be spaced apart from a first electrode 130f by one region of the interconnection insulating layer 190 disposed between first electrodes 130f.

Figure 9A:
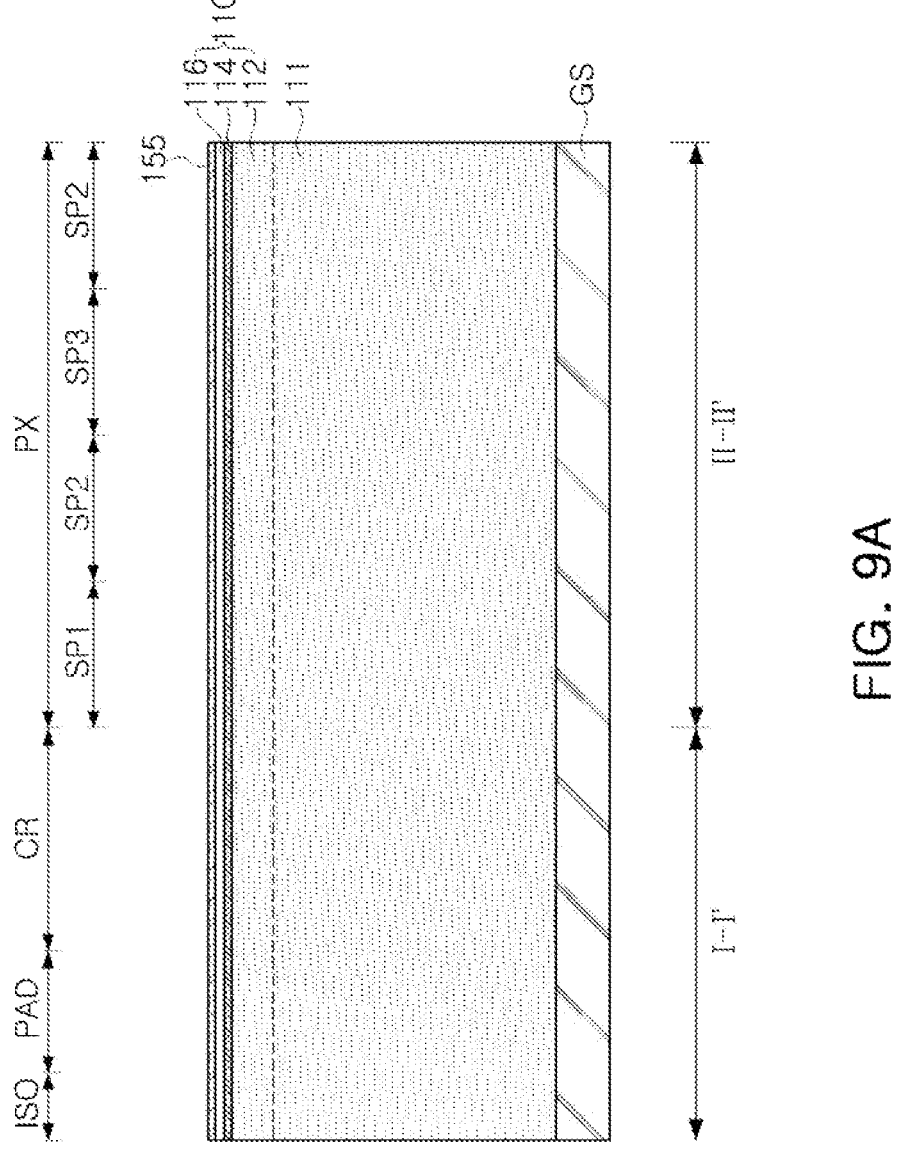
FIGS. 9A to 9Q are cross-sectional views of stages in a method of manufacturing a display apparatus according to example embodiments.
Figure 9B:
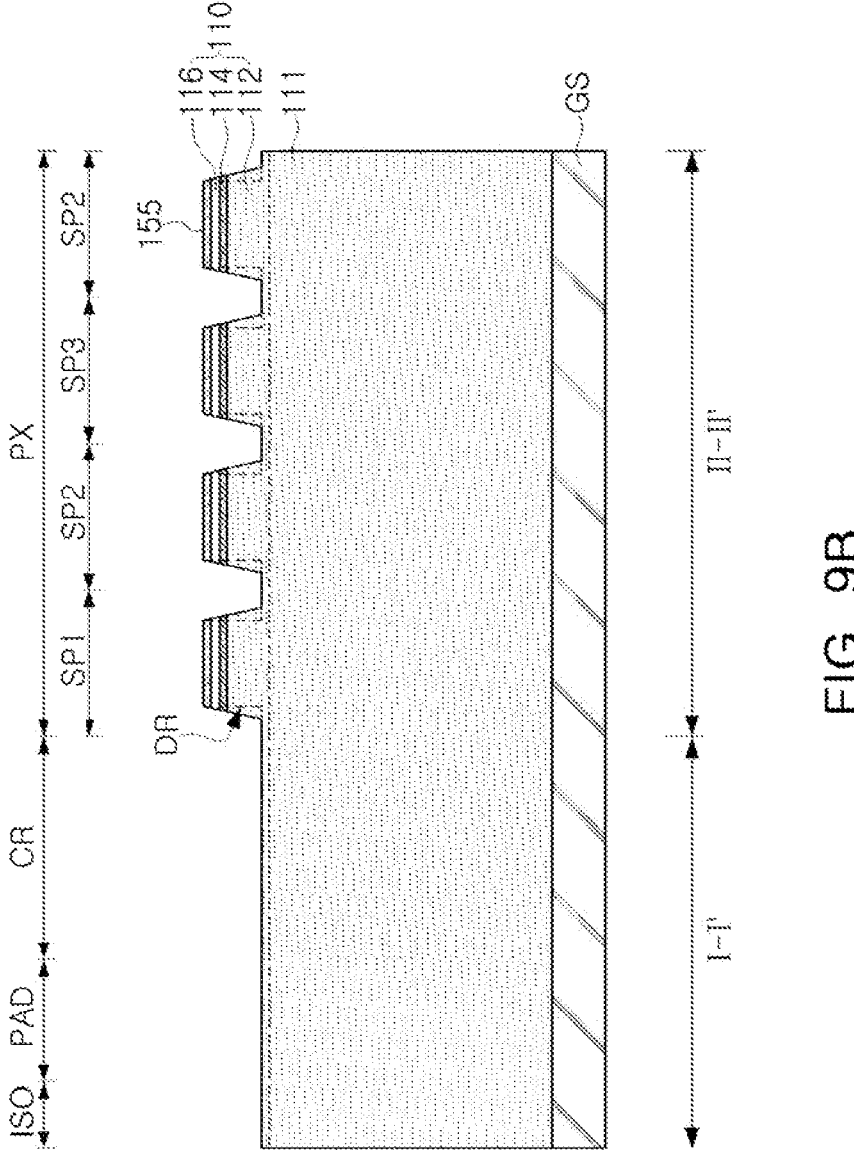
Figure 9C:
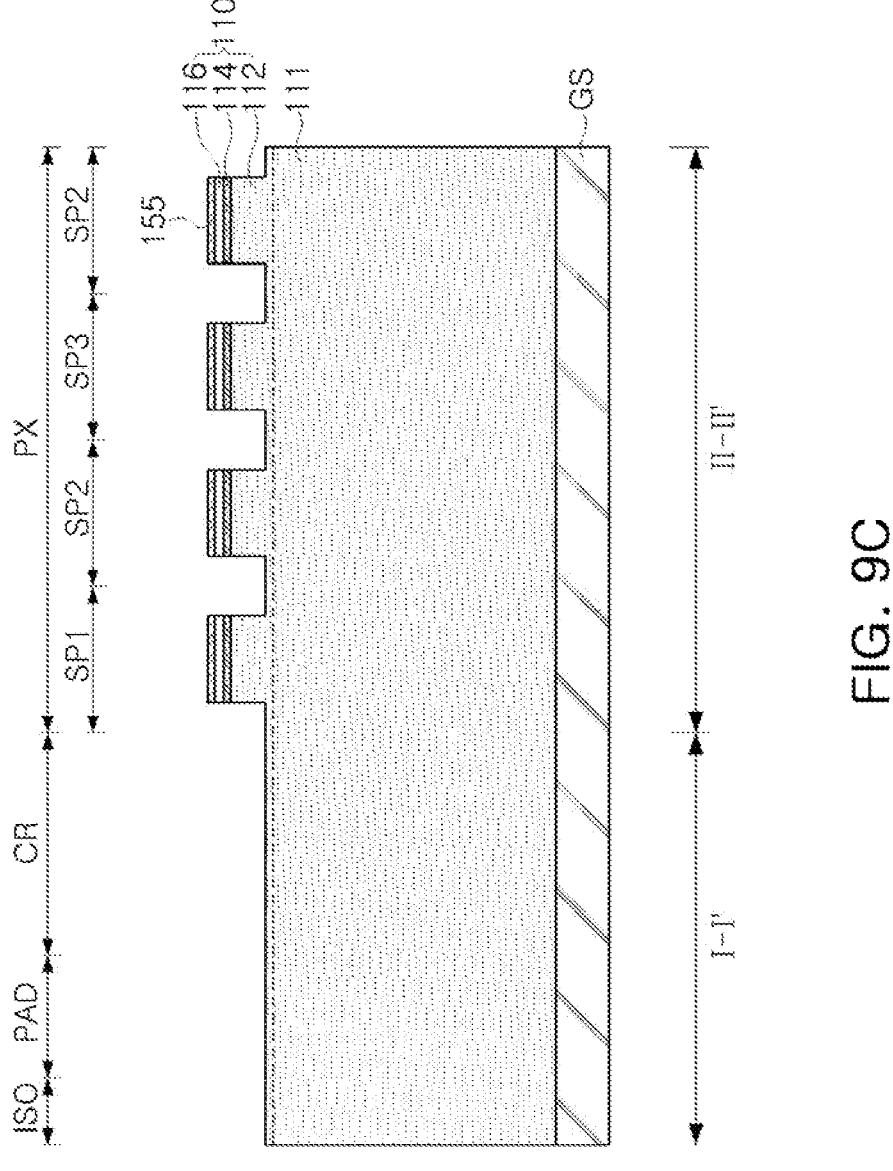
Figure 9D:
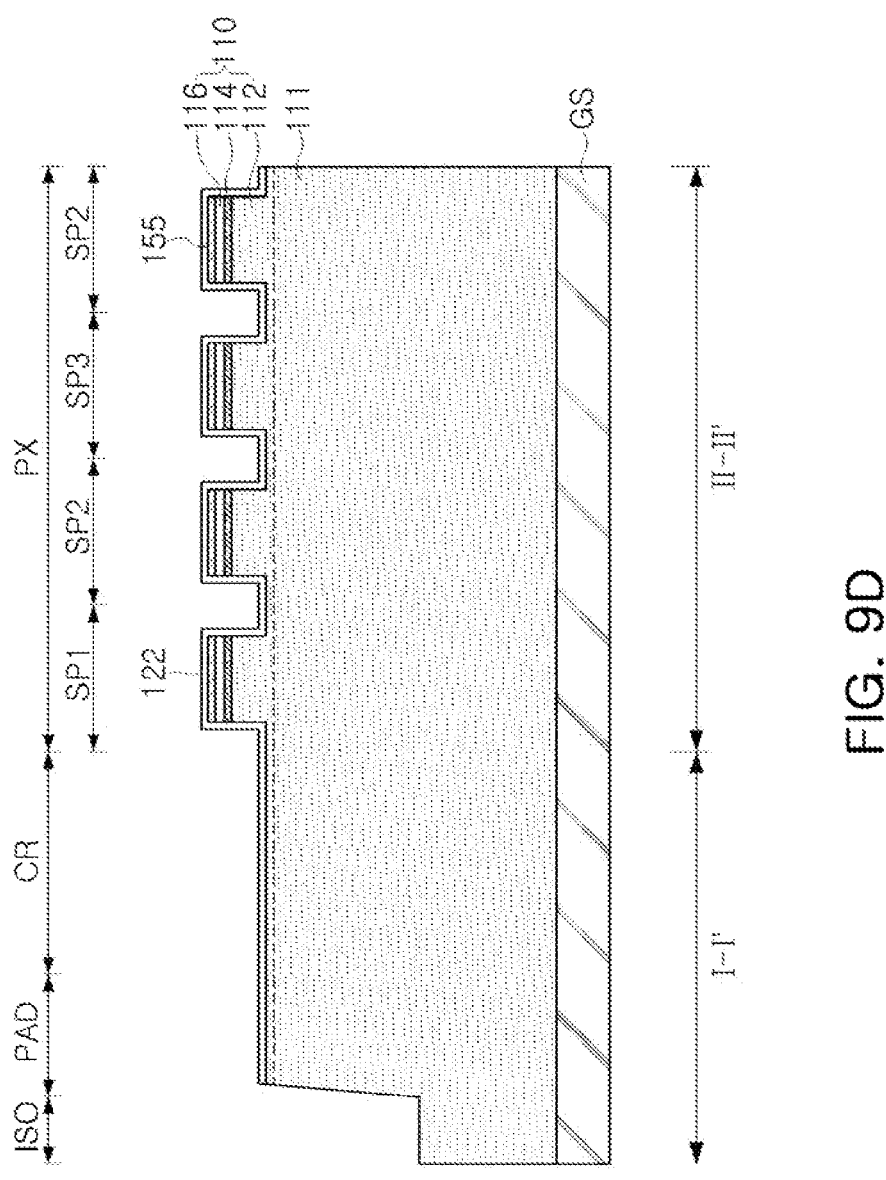
Figure 9E:
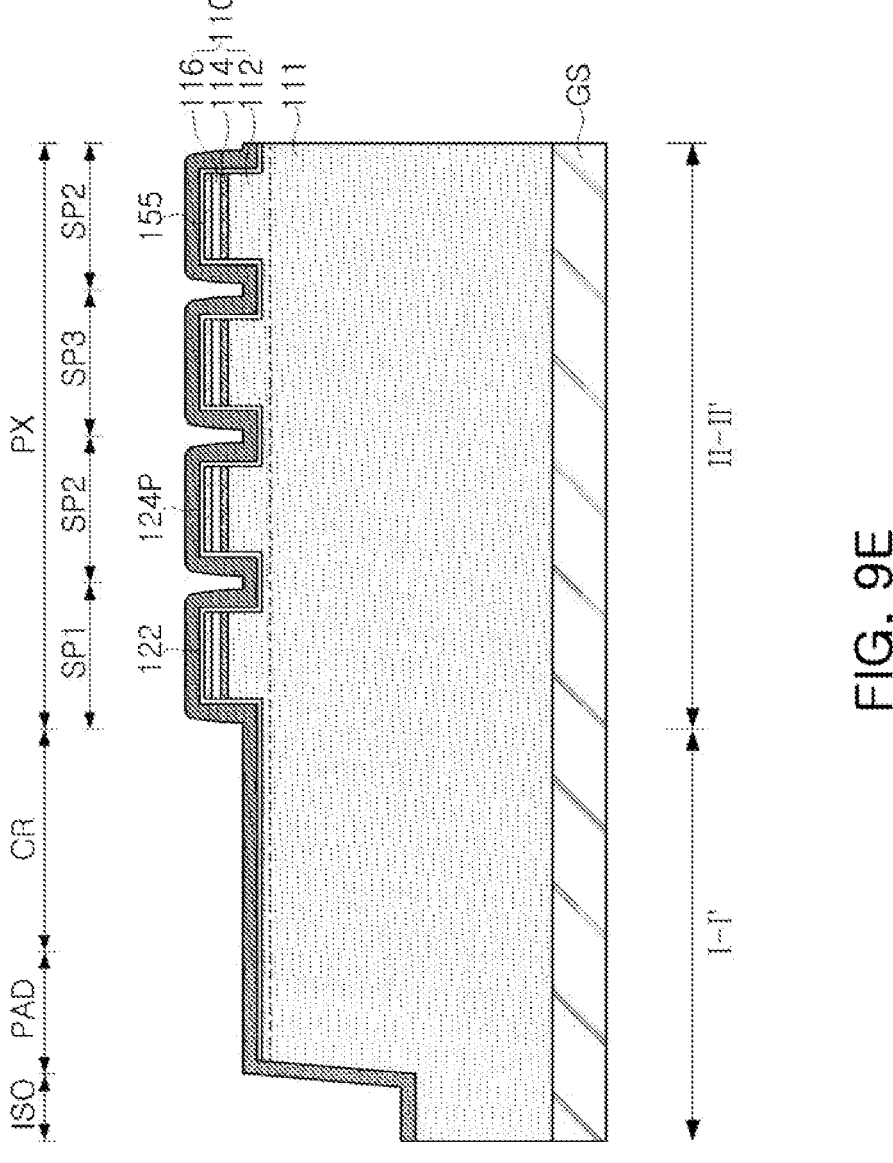
Figure 9F:
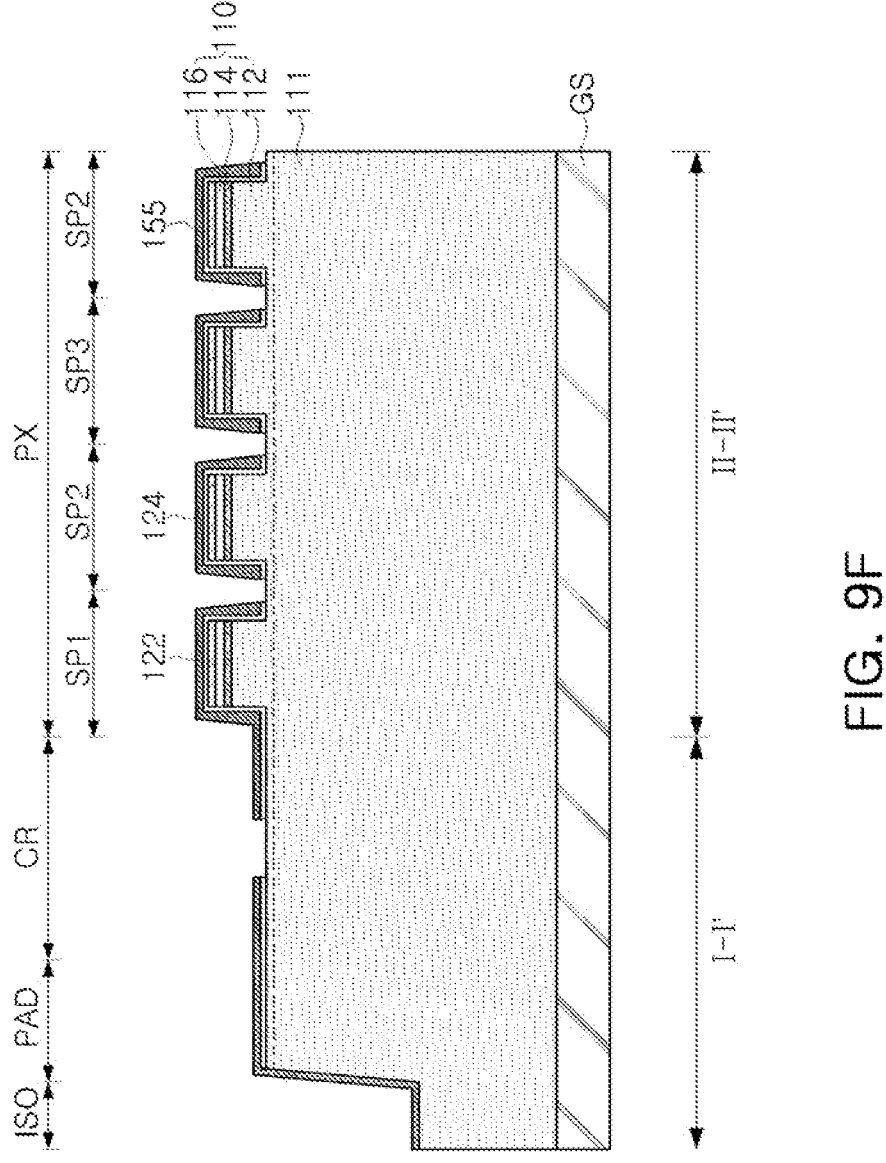
Figure 9G:
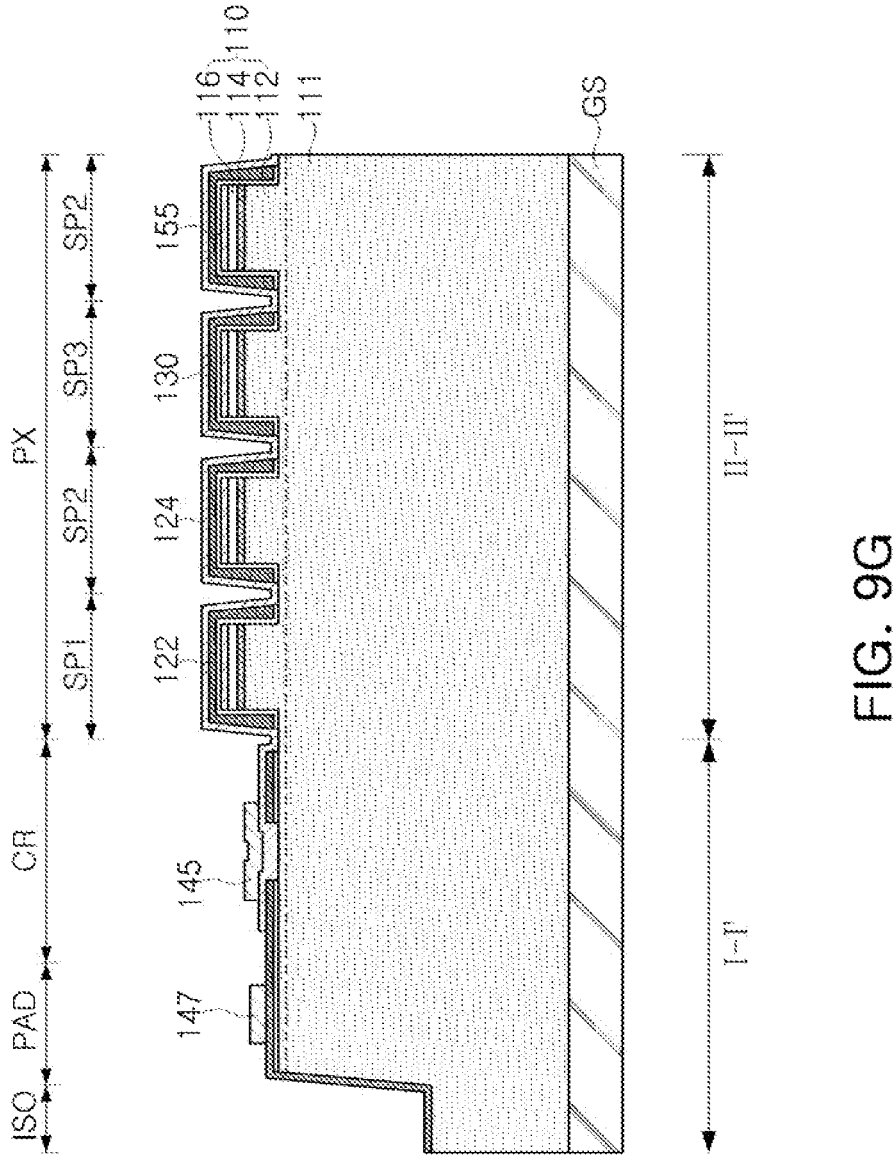
Figure 9H:
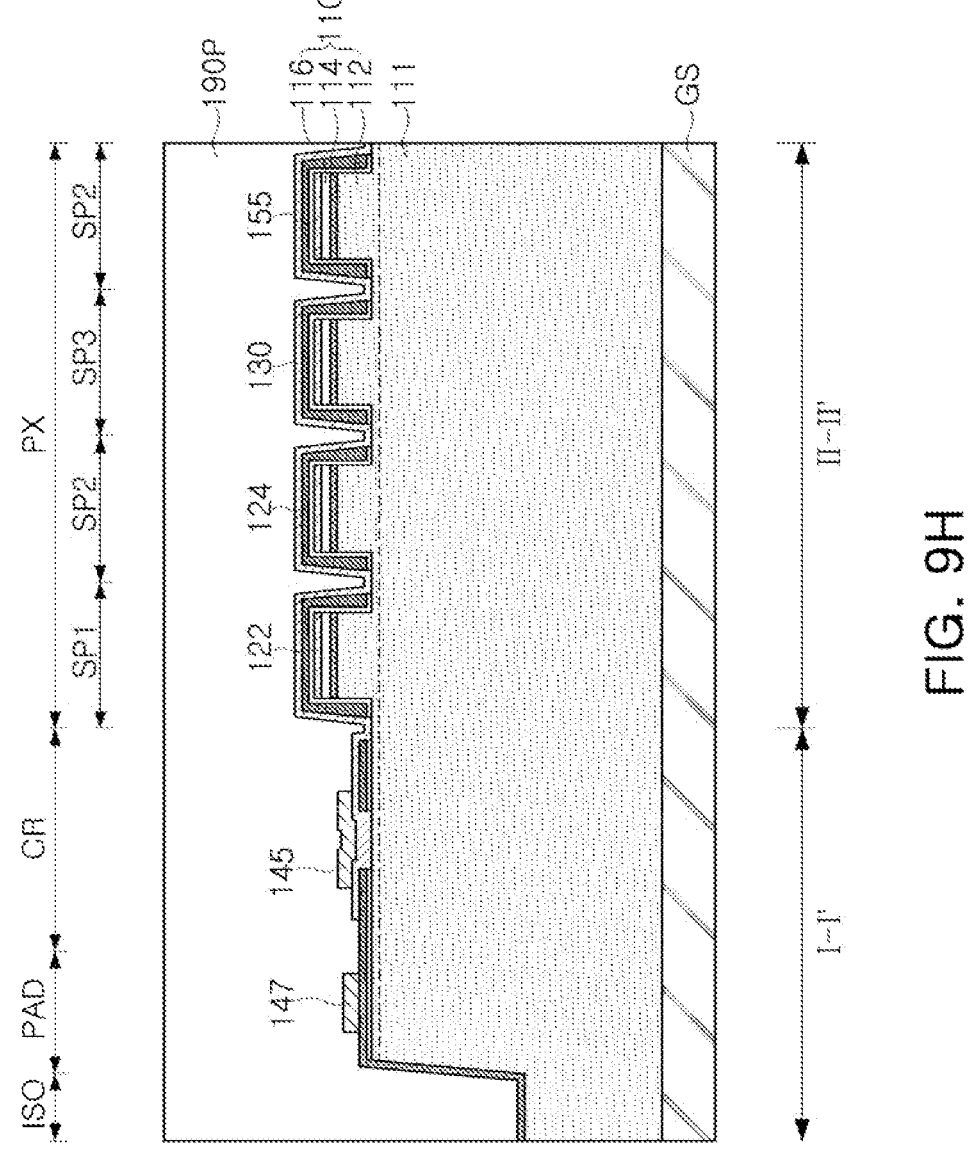
Figure 9I:
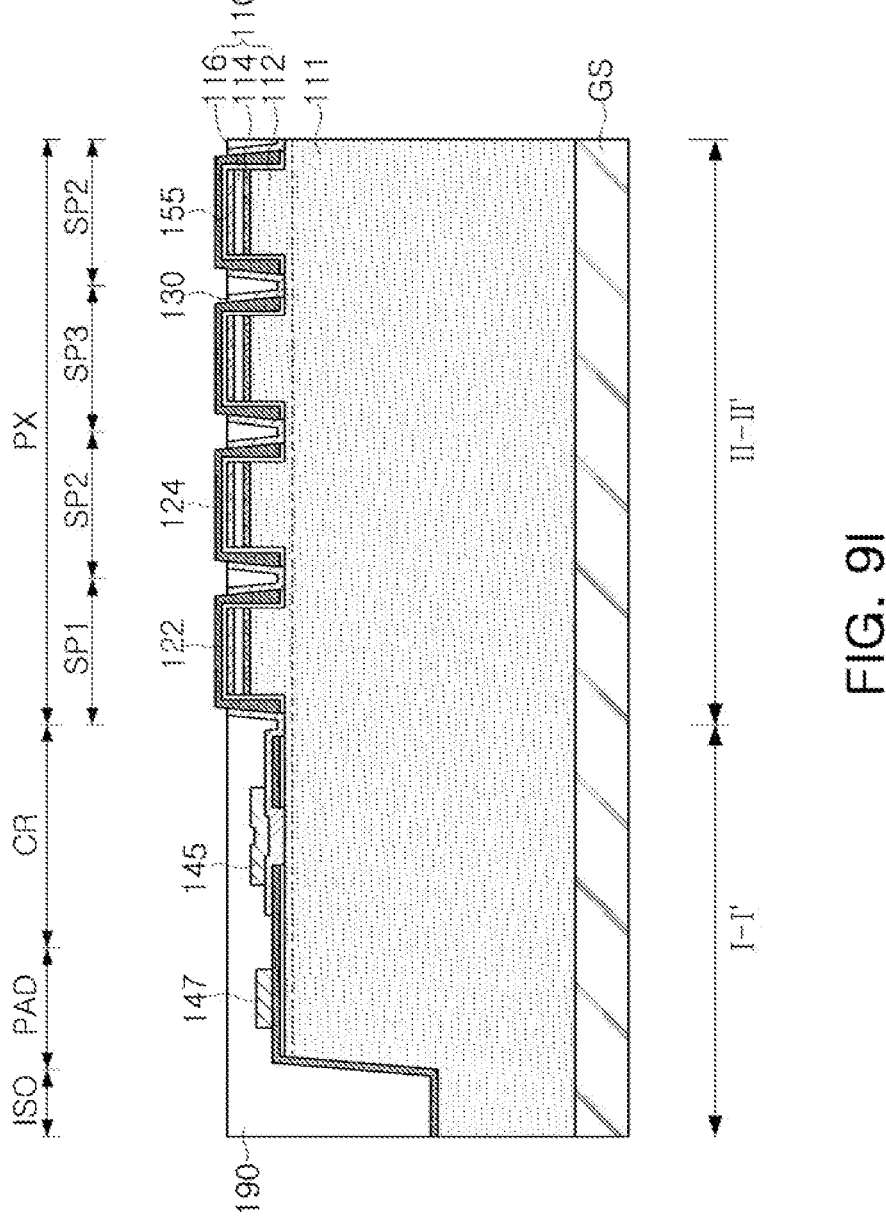
Figure 9J:
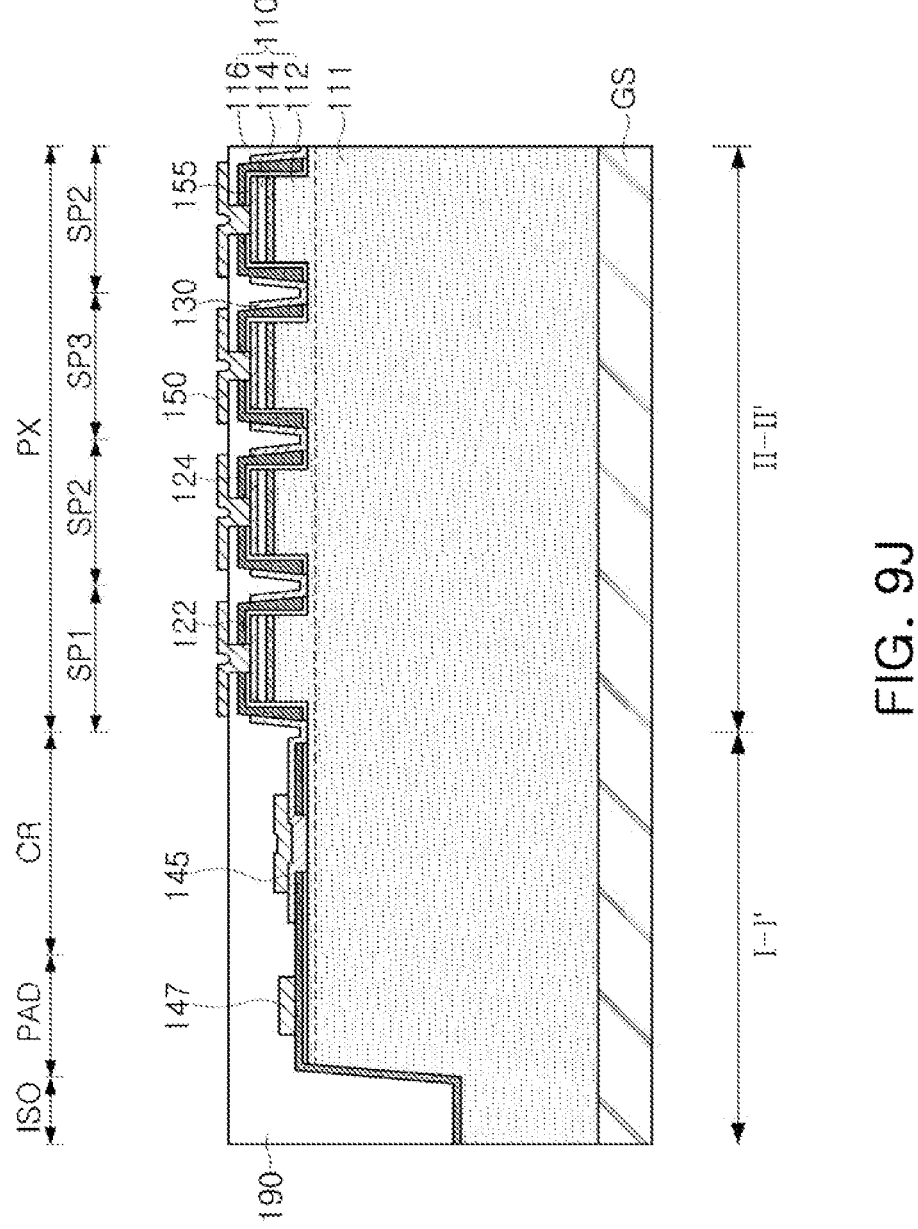
Figure 9K:
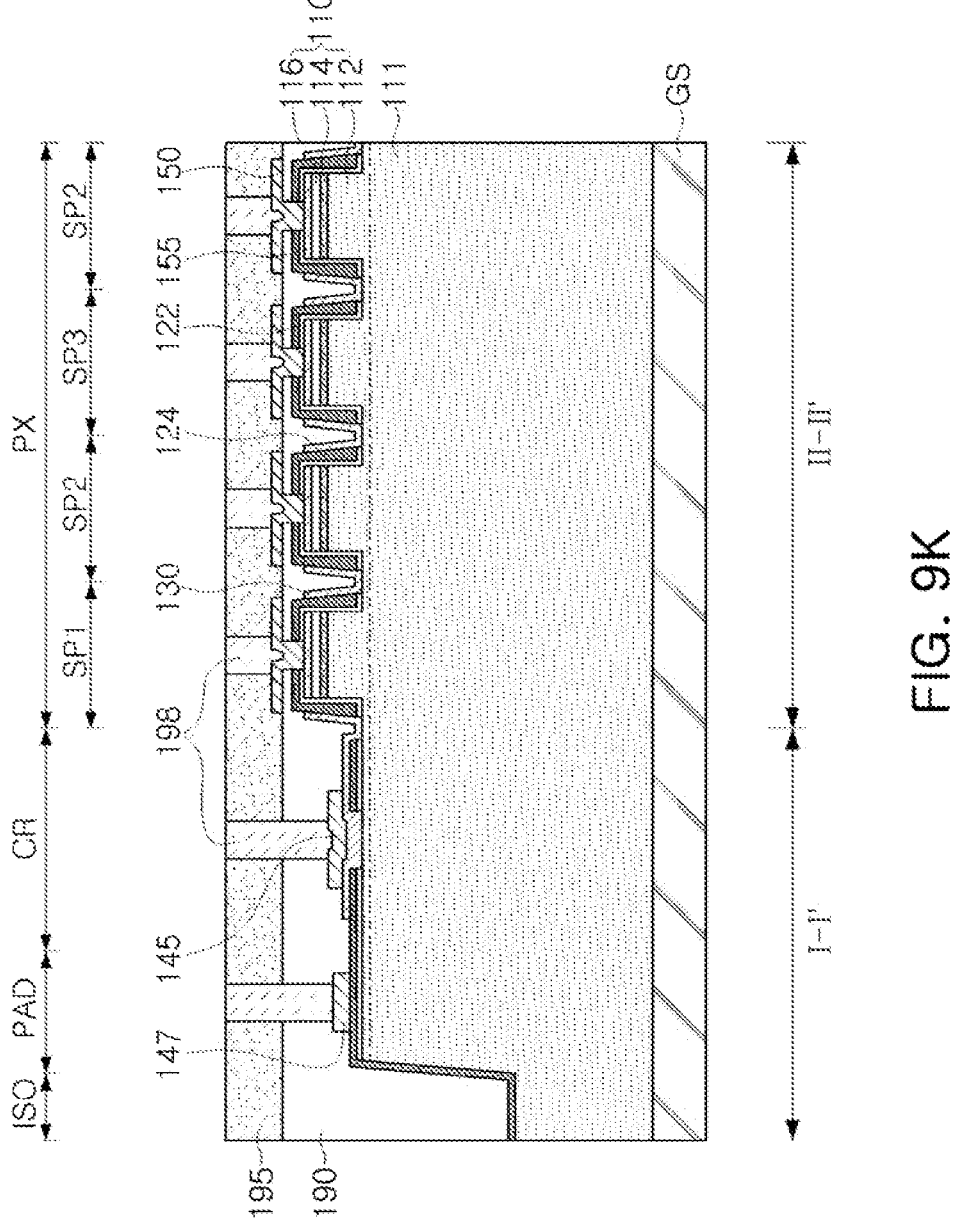
Figure 9L:
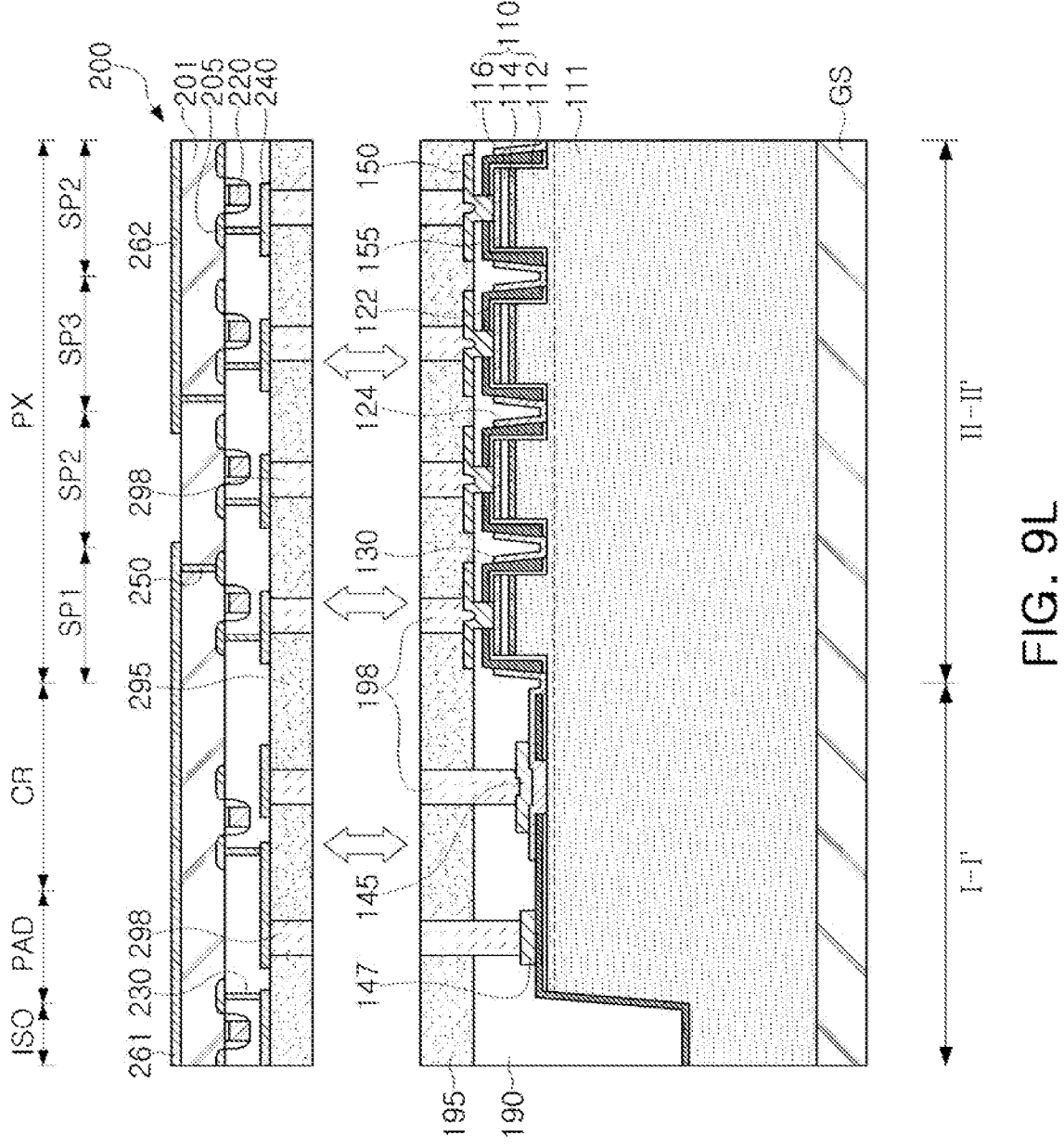
Figure 9M:
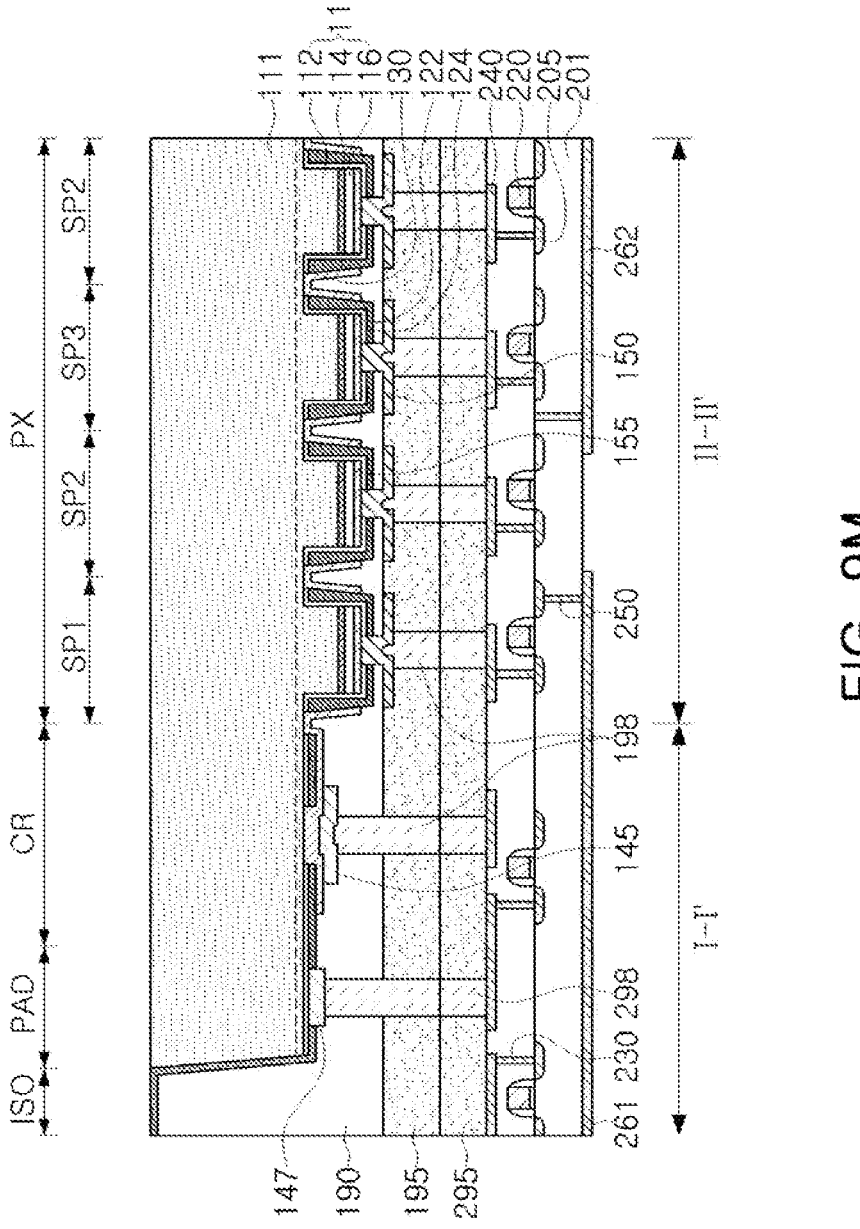
Figure 9N:
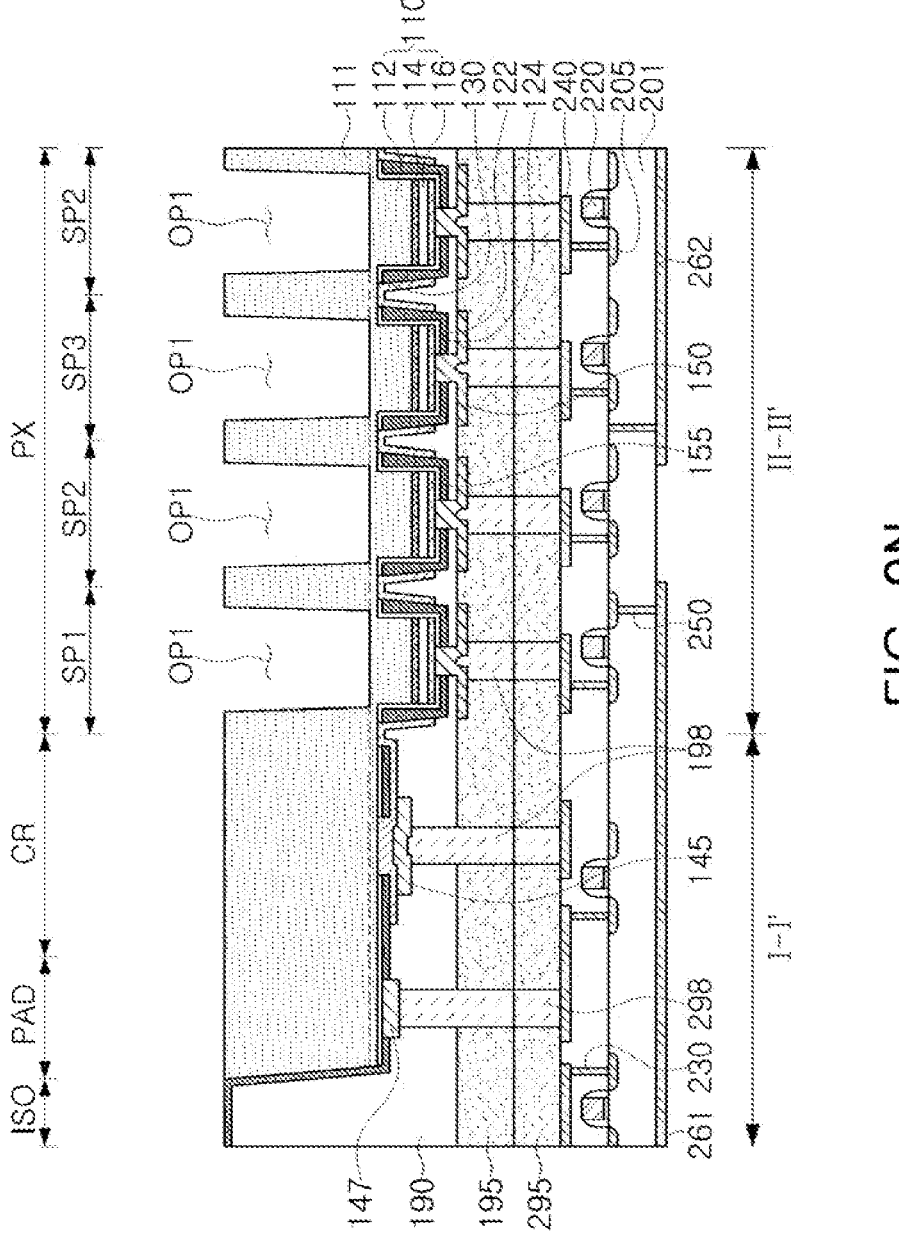
Figure 90:
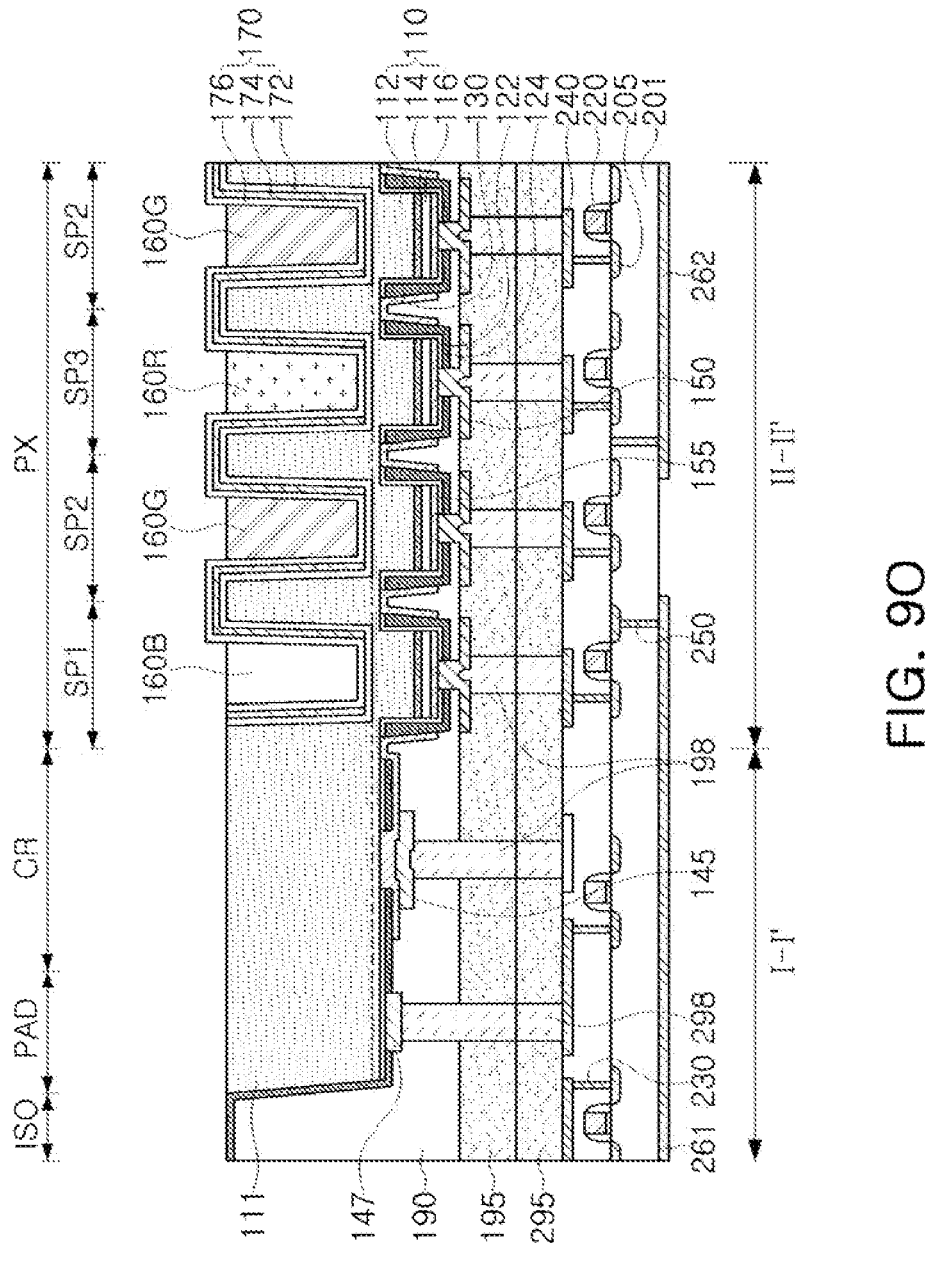
Figure 9P:
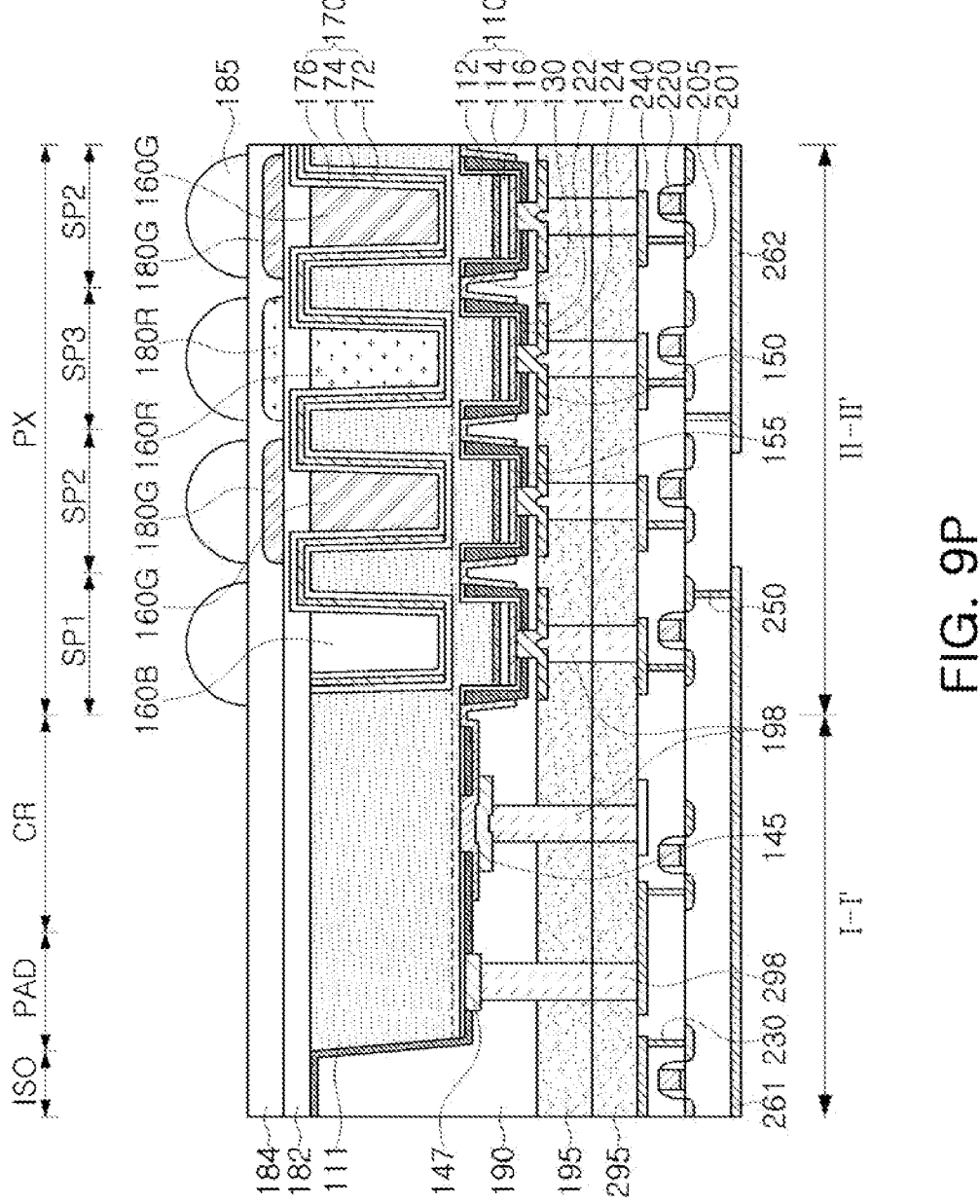
Figure 9Q:
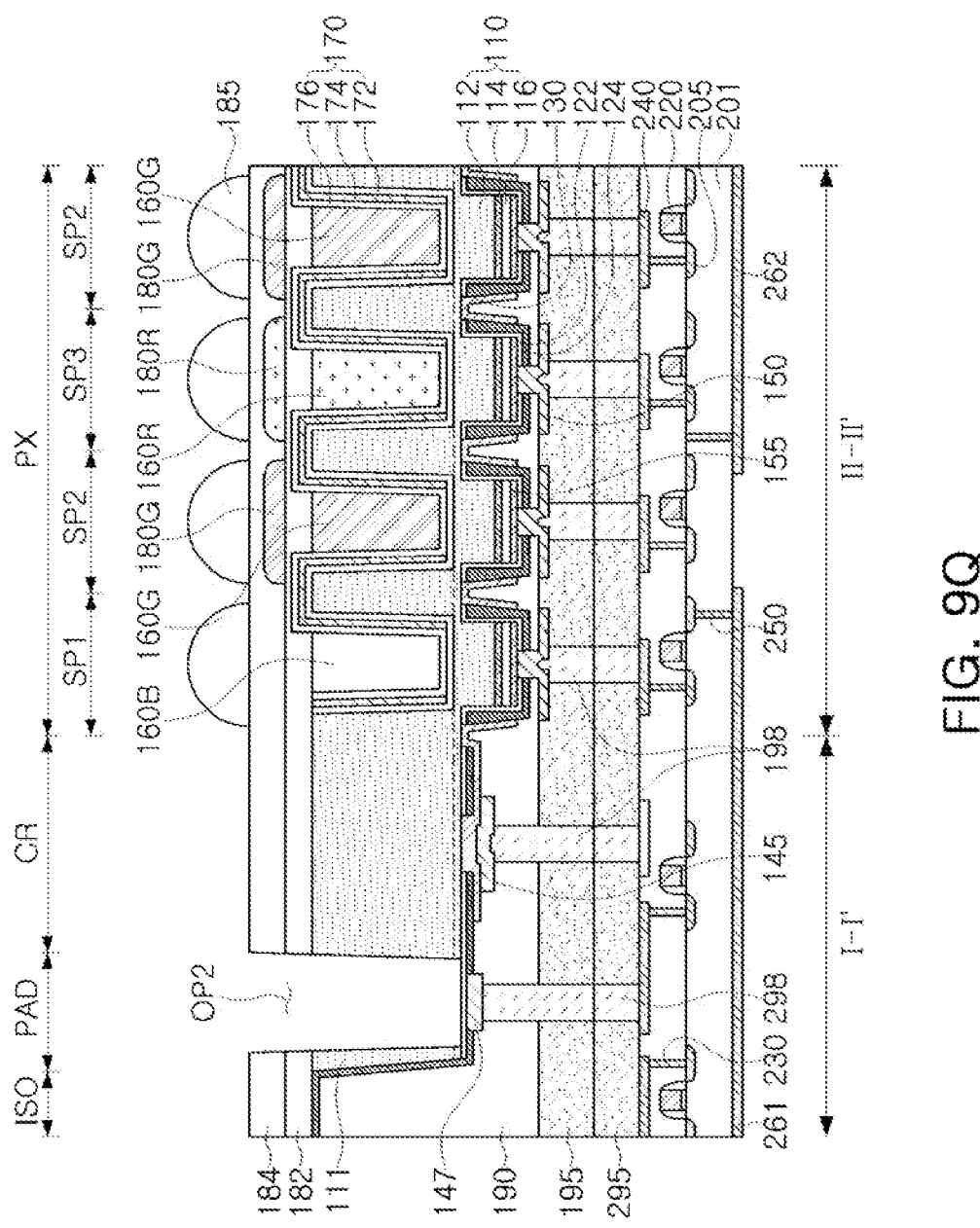

FIGS. 9A to 9Q are cross-sectional views of stages in a method of manufacturing a display apparatus according to example embodiments. An example of a method of manufacturing the display apparatus according to the example embodiment of FIGS. 2A and 2B is illustrated in FIGS. 9A to 9Q.

Referring to FIG. 9A, the upper semiconductor layer 111, the first conductivity-type semiconductor layer 112, the active layer 114, and the second conductivity-type semiconductor layer 116 may be sequentially formed on a growth substrate GS, and the contact layer 155 may be formed thereon.

The growth substrate GS may be for nitride single crystal growth, and may include, e.g., at least one of sapphire, Si, SiC, $MgAl_2O_4$, MgO, $LiAlO_2$, $LiGaO_2$, or GaN. In some example embodiments, to improve crystallinity and light extraction efficiency of semiconductor layers, the growth substrate GS may have a concave-convex structure on at least a portion of an upper surface thereof. In this case, a concave-convex structure may be formed even in layers grown thereon.

The upper semiconductor layer 111, the first conductivity-type semiconductor layer 112, the active layer 114, and the second conductivity-type semiconductor layer 116 may be formed by, e.g., a metal organic chemical vapor deposition (MOCVD) process, a hydride vapor phase epitaxy (HVPE) process, or a molecular beam epitaxy (MBE) process. The first conductivity-type semiconductor layer 112 may be an N-type nitride semiconductor layer, e.g., N-type GaN, and the second conductivity-type semiconductor layer 116 may be a P-type nitride semiconductor layer, e.g., P-type GaN/P-type AlGaN. The active layer 114 may have a multi-quantum well structure, e.g., InGaN/GaN. In some example embodiments, the upper semiconductor layer 111 may include a buffer layer. In this case, the buffer layer may be for alleviating lattice defects of the first conductivity-type semiconductor layer 112, and may include an undoped nitride semiconductor, e.g., undoped GaN, undoped AlN, or undoped InGaN.

The contact layer 155 may be formed on an upper surface of the second conductivity-type semiconductor layer 116. The contact layer 155 may be a highly reflective ohmic contact layer.

Referring to FIG. 9B, the LED cells 110 may be formed by etching a stack structure of the first conductivity-type semiconductor layer 112, the active layer 114, the second conductivity-type semiconductor layer 116, and the contact layer 155.

A portion of the stack structure may be removed by a dry etching process in the present operation, to thus form separated units of first to third sub-pixels SP1, SP2, and SP3. In the present operation, the stack structure may be etched to have an inclined side surface.

In the above operation, damaged regions DR may be partially formed on the side surfaces of the LED cells 110 by the dry etching process. Referring to FIG. 9C, the damaged regions DR may be removed from the LED cells 110. The damaged regions DR may be selectively removed by, e.g., a wet etching process. In the wet etching process, only the damaged regions DR may be selectively removed by controlling process conditions, e.g., different etch selectivity between crystal planes. Therefore, an angle between an upper surface and side surfaces of the LED cells 110 may be a right angle or close to the right angle, and non-radiative recombination due to the damaged regions DR may be reduced to improve luminance in the final device.

Referring to FIG. 9D, the passivation layer 120 may be formed, and a portion of the upper semiconductor layer 111 may be removed from an edge region ISO.

The first passivation layer 122 may be formed on the upper surface of the laminate structure to have a uniform thickness. The first passivation layer 122 may include at least one of, e.g., $SiO_2$, SiN, SiCN, SiOC, SiON, SiOCN, $HfO_2$, and $Al_2O_3$. In some example embodiments, the first passivation layer 122 may include a metal oxide disposed on an uppermost portion, and the first passivation layer 122 may include, e.g., a $SiO_2$ layer, a $HfO_2$ layer, and an $Al_2O_3$ layer sequentially stacked. The first passivation layer 122 may be conformally formed to have a substantially uniform thickness.

In the edge region ISO, a semiconductor layer constituting the upper semiconductor layer 111 and the first conductivity-type semiconductor layer 112 may be removed to have a predetermined depth. The edge region ISO may be a region to be cut in a subsequent process, and may be a region for separating modules. Therefore, in the present operation, a portion of the semiconductor layer may be removed to prevent cracking from occurring in the cutting or dicing process.

Referring to FIG. 9E, a preliminary second passivation layer 124P may be formed.

The preliminary second passivation layer 124P may be formed on an upper surface of the stack structure. The preliminary second passivation layer 124P may be formed by, e.g., a plasma enhanced chemical vapor deposition (PECVD) process. In an example embodiment, the preliminary second passivation layer 124P may include, e.g., $SiO_2$. A thickness of the preliminary second passivation layer 124P may be determined in consideration of a thickness of the finally formed second passivation layer 124.

Referring to FIG. 9F, the second passivation layer 124 may be formed by removing a portion of the preliminary second passivation layer 124P.

The preliminary second passivation layer 124P may be removed from the upper surface to have a predetermined thickness using, e.g., an etch-back process. When the first passivation layer 122 includes a metal oxide layer on the uppermost portion, the first passivation layer 122 may function as an etch-stop layer during the etch-back process. The preliminary second passivation layer 124P may be relatively more removed on the upper surface of the LED cells 110 and relatively less removed on the side surfaces of the LED cells 110. Thus, a second passivation layer 124 having external side surfaces inclined as in illustrated in FIG. 9F may be formed. A shape of the second passivation layer 124 may be adjusted by controlling conditions of the present process.

In a region, e.g., regions in which the first electrode 130 (see FIG. 2A) is to be formed, the first and second passivation layers 122 and 124 may be removed.

Referring to FIG. 9G, the first electrode 130, the common electrode 145, and the first pad electrode 147 may be formed.

The first electrode 130 may be conformally formed on the first and second passivation layers 122 and 124 and the first conductivity-type semiconductor layer 112. Accordingly, the first electrode 130 may have a substantially uniform thickness, and the internal surface in contact with the external surface of the second passivation layers 124 may be an inclined surface. The first electrode 130 may be formed in the pixels PX and the connection region CR.

The common electrode 145 and the first pad electrode 147 may be formed in the connection region CR and the connection pad PAD, respectively. The common electrode 145 may be formed on the first electrode 130, and the first pad electrode 147 may be formed on the second passivation layer 124. The common electrode 145 and the first pad electrode 147 may be formed together through the same process. The first electrode 130, the common electrode 145, and the first pad electrode 147 may include a conductive material, e.g., a metal.

Referring to FIG. 9H, a preliminary interconnection insulating layer 190P may be formed.

The preliminary interconnection insulating layer 190P may be formed to cover all structures, formed in the previous operations, including the first electrode 130. For example, the preliminary interconnection insulating layer 190P may be a low-k dielectric material, e.g., a silicon oxide.

Referring to FIG. 9I, a portion of the preliminary interconnection insulating layer 190P may be removed to form the interconnection insulating layer 190.

For example, a portion of the preliminary interconnection insulating layer 190P may be removed from the top using a planarization process, e.g., a chemical mechanical polishing (CMP) process or an etch-back process. In the operation of removing the preliminary interconnection insulating layer 190P, the first electrode 130 may also be removed from the upper surfaces of the LED cells 110, and may remain only on the side surfaces of the LED cells 110.

Referring to FIG. 9J, the second electrodes 150 connected to the contact layers 155 may be formed.

The interconnection insulating layer 190 may be additionally formed, and contact holes may be formed to expose the contact layers 155 through the interconnection insulating layer 190 and the passivation layer 120. By filling the contact holes with a conductive material, contact layers 155 may be formed to fill the contact holes and to extend on the upper surface of the interconnection insulating layer 190.

Referring to FIG. 9K, the second bonding insulating layer 195 may be formed on the second electrodes 150, and the second bonding electrodes 198 may be formed.

The second bonding insulating layer 195 may include a material that is the same as or different from a material of the interconnection insulating layer 190. In some example embodiments, a thickness of the second bonding insulating layer 195 may vary, e.g., within a scope in which the second bonding insulating layer 195 constitutes one surface of the pixel array 100 (see FIG. 2A).

The second bonding electrodes 198 may be prepared by forming via holes penetrating through the second bonding insulating layer 195 and the interconnection insulating layer 190 and then filling the via holes with a conductive material. The second bonding electrodes 198 may be formed to be connected to the second electrodes 150, the common electrode 145, and the first pad electrode 147.

Referring to FIG. 9L, a structure combining the LED cells 110 and the circuit substrate 200 may formed by bonding.

The circuit substrate 200 may be prepared by an additional process. The structure and the circuit substrate 200 may be bonded on a wafer level by a wafer bonding method, e.g., the above-described hybrid bonding method. First bonding electrodes 298 may be bonded to the second bonding electrodes 198, and the first bonding insulating layer 295 may be bonded to the second bonding insulating layer 195. Accordingly, the structure including the LED cells 110 and the circuit substrate 200 may be connected without an adhesive layer.

In the following drawings, for better understanding, the structure including the LED cells 110 is illustrated as having a bonded state in a mirror image, e.g., inverted image, of the structure illustrated in FIG. 9L.

Referring to FIG. 9M, the growth substrate GS may be removed from the upper semiconductor layer 111, and a portion of the upper semiconductor layer 111 may be removed.

The growth substrate GS may be removed by various processes, e.g., a laser lift-off process, a mechanical polishing process, a mechanical chemical polishing process, or an etching process.

A portion of the upper semiconductor layer 111 may be removed to reduce the predetermined thickness using, e.g., a polishing process such as CMP. The upper semiconductor layer 111 may be removed, e.g., to a level corresponding to a height of upper surfaces of wavelength converters 160R, 160G, and 160B (see FIG. 2A), and may be removed to not remain in the edge region ISO (see FIG. 3). In some example embodiments, the second passivation layer 124 of the edge region ISO may also be removed in the present operation.

Referring to FIG. 9N, first openings OP1 may be formed in the upper semiconductor layer 111.

The first openings OP1 may be formed by removing the upper semiconductor layer 111 in a region in which wavelength converters 160R, 160G, and 160B (see FIG. 2A) are to be disposed. In the present example embodiment, in the present operation, the first openings OP1 may be formed such that the first conductivity-type semiconductor layer 112 is not completely separated between the LED cells 110. Accordingly, the first conductivity-type semiconductor layer 112 may be continuously disposed between an upper surface of the first electrode 130 and bottom surfaces of the first openings OP1.

Referring to FIG. 9O, the partition reflective layers 170 and the wavelength converters 160R, 160G, and 160B may be formed in the first openings OP1.

The partition reflective layers 170 may be prepared by forming the first partition insulating layer 172 and the partition metal layer 174, removing the partition metal layer 174 from the bottom surfaces of the first openings OP1, and then forming the second partition insulating layer 176.

The first wavelength converter 160B may be prepared by forming a transparent resin on the partition reflective layer 170, and the second and third wavelength converters 160G and 160R may be prepared by forming a transparent resin mixed with a wavelength conversion material. The wavelength conversion material may convert blue light into green light and red light with the second and third wavelength converters 160G and 160R, respectively. The transparent resin may include, e.g., a silicone resin or an epoxy resin. Alternatively, according to some example embodiments, the wavelength converters 160R, 160G, and 160B may be formed of a silicon oxide, e.g., $SiO_2$, rather than the transparent resin.

Referring to FIG. 9P, color filters 180G and 180R and microlenses 185 may be formed on the wavelength converters 160B, 160G, and 160R.

An encapsulation layer 182 may be formed on the wavelength converters 160B, 160G, and 160R to protect the wavelength converters 160B, 160G, and 160R from environmental factors such as moisture, oxygen, or the like. The color filters 180G and 180R may be formed on the second and third wavelength converters 160G and 160R, respectively. In some example embodiments, the color filters 180G and 180R may also be formed on the first wavelength converter 160B.

A planarization layer 184 may be formed to cover the color filters 180G and 180R, and microlenses 185 may be formed. The microlenses 185 may be formed by, e.g., forming a lens material layer of an exposable material using a spray or spin coating process, directly patterning the lens material layer, and reflowing the patterned lens material layer. Alternatively, the microlens 185 may be formed by forming a lens material layer, forming an additional mask layer including lens patterns, and performing an etching process, such as a dry etching process, on the lens material layer using the mask layer to transfer shapes of the lens patterns.

Referring to FIG. 9Q, the second opening OP2 may be formed by removing the planarization layer 184, the encapsulation layer 182, the upper semiconductor layer 111, and the first conductivity-type semiconductor layer 112 on the first pad electrode 147.

The second opening OP2 may be formed to expose the first passivation layer 122 on the first pad electrode 147 in the connection pad PAD.

Referring to FIG. 2A together, after removing a portion of the passivation layer 120 exposed through the second opening OP2, the second pad electrode 199 may be formed and adjacent modules may be diced in the edge region ISO, to complete manufacturing of the display apparatus 10.

Figure 10:
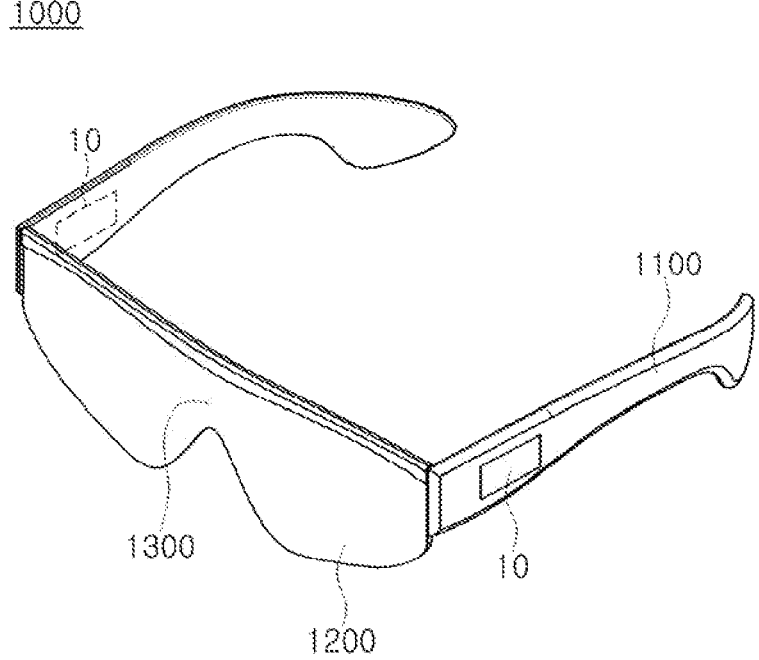
FIG. 10 is a conceptual diagram of an electronic apparatus including a display apparatus according to example embodiments.

FIG. 10 is a conceptual diagram of an electronic apparatus including a display apparatus according to example embodiments.

Referring to FIG. 10, an electronic device 1000 may be a glasses-type display, e.g., a wearable device. The electronic device 1000 may include a pair of temples 1100, a pair of light coupling lenses 1200, and a bridge 1300. The electronic device 1000 may include a display apparatus 10 including an image generator.

The electronic device 1000 may be a head-mounted, glasses-type, or goggles-type virtual reality (VR) device, for providing virtual reality or providing a virtual image and an external real landscape together, an augmented reality (AR) device, or a mixed reality (MR) device.

The temples 1100 may be spaced apart from each other, and may extend in parallel. The display apparatus 10 may be disposed in the temples 1100, and projection lenses may be additionally disposed therein. The temples 1100 may be folded to face the bridge 1300. The light coupling lenses 1200 may include a light guide plate, and may include input/output gratings. The bridge 1300 may be provided between the light coupling lenses 1200 to connect the light coupling lenses 1200 to each other.

The display apparatus 10 may be disposed on each of the temples 1100, and may generate images on the light coupling lenses 1200. For example, after light from the display apparatus 10 is incident on the projection lenses, the light may be transmitted along the light guide plate of the light coupling lenses 1200 to generate an image. The display apparatus 10 may be a display apparatus according to the example embodiments described above with reference to FIGS. 1 to 8.

As described above, according to example embodiments, a first electrode may be disposed to have an inclined surface, and thus, a display apparatus having improved light extraction efficiency may be provided.

As described above, embodiments relate to a display apparatus including a light emitting diode (LED). Embodiments may provide a display apparatus having improved light extraction efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a circuit substrate including driving circuits and first bonding electrodes; and
   a pixel array on the circuit substrate, the pixel array including light emitting diode (LED) cells, constituting a plurality of pixels, and second bonding electrodes bonded to the first bonding electrodes, wherein:

each of the LED cells includes a first conductivity-type semiconductor layer, an active layer, and a second conductivity-type semiconductor layer sequentially stacked, and the pixel array further includes:

wavelength converters on the LED cells;

an upper semiconductor layer on the LED cells and having a partition structure surrounding side surfaces of the wavelength converters and separating the wavelength converters from each other;

a passivation layer on side surfaces of the LED cells and having external side surfaces inclined to increase a thickness of the passivation layer in a direction toward the wavelength converters;

a first electrode on the external side surfaces of the passivation layer and extending to a region between the LED cells;

second electrodes, respectively on lower surfaces of the LED cells and connected to the second conductivity-type semiconductor layers;

a common electrode on at least one side of the LED cells; and a pad electrode outside the LED cells and electrically connected to the driving circuits.

2. The display apparatus as claimed in claim 1, wherein the passivation layer extends on the lower surfaces of the LED cells.

3. The display apparatus as claimed in claim 1, wherein:

the pixel array further includes an upper passivation layer between the passivation layer and the LED cells, and the upper passivation layer has external side surfaces that are substantially perpendicular to the lower surfaces of the LED cells, such that the external side surfaces and the lower surfaces form an angle with a value within a range of 85 degrees to 95 degrees.

4. The display apparatus as claimed in claim 3, wherein the passivation layer includes a semiconductor oxide, and the upper passivation layer includes a metal oxide.

5. The display apparatus as claimed in claim 1, wherein the first electrode is disposed to not overlap the active layers and the second conductivity-type semiconductor layers of the LED cells in a direction perpendicular to the lower surfaces of the LED cells.

6. The display apparatus as claimed in claim 1, wherein the first electrode has a substantially uniform thickness on the external side surfaces of the passivation layer.

7. The display apparatus as claimed in claim 1, wherein the first electrode is disposed to fill a space between the LED cells.

8. The display apparatus as claimed in claim 1, wherein the upper semiconductor layer is connected to the first conductivity-type semiconductor layer and includes a same material as the first conductivity-type semiconductor layer.

9. The display apparatus as claimed in claim 8, wherein the upper semiconductor layer includes an epitaxial nitride semiconductor layer.

10. The display apparatus as claimed in claim 1, wherein the first electrode includes an ohmic contact layer in contact with the first conductivity-type semiconductor layer and a reflective electrode layer on a lower surface of the ohmic contact layer.

11. A display apparatus, comprising:

a circuit substrate including driving circuits; and a pixel array on the circuit substrate, the pixel array including:

light emitting diode (LED) cells constituting a plurality of pixels, each of the LED cells including a first conductivity-type semiconductor layer, an active layer, and a second conductivity-type semiconductor layer, sequentially stacked;

wavelength converters on the LED cells;

an upper semiconductor layer on the LED cells and having a partition structure surrounding side surfaces of the wavelength converters and separating the wavelength converters from each other;

a passivation layer on side surfaces of the LED cells and having external side surfaces inclined to increase a thickness of the passivation layer in a direction toward the wavelength converters;

a first electrode along a region of the LED cells to have a grid shape;

second electrodes connected to the second conductivity-type semiconductor layers; and reflective layers between the first electrode and the second electrodes along the passivation layer on the side surfaces of the LED cells and having inclined surfaces that are inclined toward outside of the LED cells.

12. The display apparatus as claimed in claim 11, wherein the reflective layers are connected to the first electrode.

13. The display apparatus as claimed in claim 11, wherein the reflective layers are connected to the second electrodes.

14. The display apparatus as claimed in claim 11, wherein the reflective layers are disposed to be spaced apart from the first electrode and the second electrodes.

15. The display apparatus as claimed in claim 11, wherein the inclined surfaces of the reflective layers are inclined such that a distance between upper ends is greater than a distance between lower ends.

16. The display apparatus as claimed in claim 11, wherein the wavelength converters have side surfaces inclined such that a width of an upper portion is greater than a width of a lower portion.

17. The display apparatus as claimed in claim 11, wherein the pixel array further includes a partition reflective layer covering the side surfaces of the wavelength converters and including a first partition insulating layer, a partition metal layer, and a second partition insulating layer, sequentially stacked.

18. The display apparatus as claimed in claim 17, wherein the partition reflective layer extends on an upper surface of the upper semiconductor layer between the wavelength converters.

19. A display apparatus, comprising:

a circuit substrate including driving circuits and first bonding electrodes; and a pixel array on the circuit substrate and including light emitting diode (LED) cells constituting a plurality of pixels, each of the LED cells including a first conductivity-type semiconductor layer, an active layer, and a second conductivity-type semiconductor layer, sequentially stacked, wherein:

the pixel array further includes:

wavelength converters on the LED cells;

a passivation layer on side surfaces of the LED cells and having external side surfaces inclined to increase a thickness of the passivation layer in a direction toward the wavelength converters;

a first electrode having inclined surfaces in contact with the passivation layer;

second electrodes connected to the second conductivity-type semiconductor layers;

a common electrode on at least one side of the LED cells; and second bonding electrodes bonded to the first bonding electrodes, the first electrode is disposed in a region between the LED cells adjacent to each other to not overlap the LED cells vertically, and is electrically connected to a portion of the second bonding electrodes through the common electrode in an outside of the LED cells, and each of the second electrodes is disposed below a lower surface of each of the LED cells to overlap the LED cells vertically, and is directly connected to a portion of the second bonding electrodes.

20. The display apparatus as claimed in claim 19, wherein:

the LED cells are disposed in rows and columns, and the first electrode includes lines extending along boundaries between the LED cells.

\* \* \* \* \*